(12) United States Patent
Lucow et al.

(10) Patent No.: US 10,090,420 B2
(45) Date of Patent: Oct. 2, 2018

(54) VIA ETCH METHOD FOR BACK CONTACT MULTIJUNCTION SOLAR CELLS

(71) Applicant: Solar Junction Corporation, San Jose, CA (US)

(72) Inventors: Ewelina Lucow, Los Gatos, CA (US); Lan Zhang, Palo Alto, CA (US); Sathya Chary, San Francisco, CA (US); Ferran Suarez, San Jose, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 15/332,036

(22) Filed: Oct. 24, 2016

(65) Prior Publication Data

US 2017/0213922 A1  Jul. 27, 2017

Related U.S. Application Data

(60) Provisional application No. 62/286,100, filed on Jan. 22, 2016.

(51) Int. Cl.
| | |
|---|---|
| *H01L 31/0224* | (2006.01) |
| *H01L 31/18* | (2006.01) |
| *H01L 31/0216* | (2014.01) |
| *H01L 31/0725* | (2012.01) |
| *H01L 31/0304* | (2006.01) |

(52) U.S. Cl.
CPC ........ *H01L 31/022441* (2013.01); *H01L 31/02168* (2013.01); *H01L 31/0304* (2013.01); *H01L 31/0725* (2013.01); *H01L 31/184* (2013.01)

(58) Field of Classification Search
CPC .......... H01L 31/186; H01L 31/18; H01L 31/022441; H01L 31/02245; H01L 31/0687; H01L 31/0725; H01L 31/076; H01L 31/03685; H01L 31/03921; H01L 31/0745
See application file for complete search history.

(56) References Cited

U.S. PATENT DOCUMENTS

| | | |
|---|---|---|
| 3,903,427 A | 9/1975 | Pack |
| 4,062,698 A | 12/1977 | Blakeslee et al. |
| 4,163,677 A | 8/1979 | Carlson et al. |

(Continued)

FOREIGN PATENT DOCUMENTS

| | | |
|---|---|---|
| EP | 1953828 | 8/2008 |
| EP | 2254156 | 11/2010 |

(Continued)

OTHER PUBLICATIONS

Non-Final Office Action for U.S. Appl. No. 15/288,559, dated Dec. 22, 2016, 28 pages.

(Continued)

*Primary Examiner* — Bethany L Martin

(57) ABSTRACT

This disclosure relates to semiconductor devices and methods for fabricating semiconductor devices. Particularly, the disclosure relates to back-contact-only multijunction solar cells and the process flows for making such solar cells, including a wet etch process that removes semiconductor materials non-selectively without major differences in etch rates between heteroepitaxial III-V semiconductor layers.

17 Claims, 18 Drawing Sheets

(56) References Cited

U.S. PATENT DOCUMENTS

| | | | |
|---|---|---|---|
| 4,180,414 A | 12/1979 | Diamond et al. | |
| 4,209,347 A | 6/1980 | Klein | |
| 4,209,698 A | 6/1980 | Hoppe | |
| 4,367,368 A | 1/1983 | Wolf | |
| 4,491,681 A | 1/1985 | Kirpich | |
| 4,830,678 A | 5/1989 | Todorof et al. | |
| 4,834,805 A | 5/1989 | Erbert | |
| 4,838,952 A | 6/1989 | Dill et al. | |
| 4,999,060 A | 3/1991 | Szekely et al. | |
| 5,118,361 A | 6/1992 | Fraas et al. | |
| 5,178,685 A | 1/1993 | Borenstein et al. | |
| 5,460,659 A | 10/1995 | Krut | |
| 5,500,052 A | 3/1996 | Horiuchi et al. | |
| 5,700,737 A | 12/1997 | Yu et al. | |
| 5,741,626 A | 4/1998 | Jain et al. | |
| 5,935,345 A | 8/1999 | Kuznicki | |
| 5,944,913 A | 8/1999 | Hou et al. | |
| 6,281,426 B1 | 8/2001 | Olson et al. | |
| 6,316,348 B1 | 11/2001 | Fu et al. | |
| 6,623,283 B1 | 9/2003 | Torigian et al. | |
| 6,663,982 B1 | 12/2003 | Stephens et al. | |
| 7,449,630 B2 | 11/2008 | Ho et al. | |
| 7,488,890 B2 | 2/2009 | Takamoto | |
| 7,514,782 B2 | 4/2009 | Hiramatsu et al. | |
| 7,687,707 B2 | 3/2010 | Meck et al. | |
| 7,727,795 B2 | 6/2010 | Stan et al. | |
| 7,851,693 B2 | 12/2010 | Fork et al. | |
| 7,972,875 B2 | 7/2011 | Rogers et al. | |
| 8,115,097 B2 | 2/2012 | Guha et al. | |
| 8,669,466 B2 | 3/2014 | Guha et al. | |
| 9,337,360 B1 | 5/2016 | Weimer et al. | |
| 2003/0029497 A1 | 2/2003 | Tanaka | |
| 2004/0119149 A1 | 6/2004 | Yin Pang et al. | |
| 2005/0072457 A1 | 2/2005 | Glenn | |
| 2005/0155641 A1 | 7/2005 | Fafard | |
| 2006/0162768 A1 | 7/2006 | Wanlass et al. | |
| 2006/0163596 A1 | 7/2006 | Kim et al. | |
| 2006/0185716 A1 | 8/2006 | Murozono et al. | |
| 2006/0240599 A1 | 10/2006 | Amano et al. | |
| 2007/0090517 A1 | 4/2007 | Moon et al. | |
| 2007/0240760 A1 | 10/2007 | Gronet | |
| 2007/0241450 A1 | 10/2007 | Hiramatsu et al. | |
| 2007/0089774 A1 | 12/2007 | Lasich | |
| 2007/0290287 A1 | 12/2007 | Freedman | |
| 2008/0105298 A1 | 5/2008 | Lu et al. | |
| 2008/0135088 A1 | 6/2008 | Corrales | |
| 2008/0150064 A1 | 6/2008 | Zimmerman et al. | |
| 2008/0185040 A1 | 8/2008 | Tom et al. | |
| 2008/0190480 A1 | 8/2008 | Joshi | |
| 2008/0230110 A1 | 9/2008 | Freedman | |
| 2008/0276981 A1 | 11/2008 | Kinoshita et al. | |
| 2008/0315398 A1 | 12/2008 | Lo et al. | |
| 2009/0020152 A1 | 1/2009 | Lin | |
| 2009/0064994 A1 | 3/2009 | Weatherby et al. | |
| 2009/0086478 A1 | 4/2009 | Sanroma et al. | |
| 2009/0120500 A1 | 5/2009 | Prather et al. | |
| 2009/0159126 A1 | 6/2009 | Chan | |
| 2009/0229659 A1 | 9/2009 | Wanlass et al. | |
| 2009/0255575 A1 | 10/2009 | Tischler | |
| 2009/0266395 A1 | 10/2009 | Murthy et al. | |
| 2009/0272438 A1 | 11/2009 | Cornfeld | |
| 2009/0298218 A1 | 12/2009 | Federici et al. | |
| 2010/0037935 A1 | 2/2010 | Viad et al. | |
| 2010/0051085 A1 | 3/2010 | Weidman et al. | |
| 2010/0089447 A1 | 4/2010 | Basol et al. | |
| 2010/0126573 A1 | 5/2010 | Youtsey et al. | |
| 2010/0132765 A1 | 6/2010 | Cumpston et al. | |
| 2010/0139752 A1 | 6/2010 | Fang | |
| 2010/0180936 A1 | 7/2010 | Kim | |
| 2010/0218816 A1* | 9/2010 | Guha | H01L 31/0682 |
| | | | 136/256 |
| 2010/0236603 A1 | 9/2010 | Menard et al. | |
| 2010/0258178 A1* | 10/2010 | Jang | H01L 31/02168 |
| | | | 136/256 |
| 2010/0294362 A1 | 11/2010 | Christ et al. | |
| 2010/0313954 A1 | 12/2010 | Seel et al. | |
| 2010/0326429 A1 | 12/2010 | Cumpston et al. | |
| 2010/0326492 A1 | 12/2010 | Tan et al. | |
| 2010/0326518 A1 | 12/2010 | Jaso et al. | |
| 2011/0030764 A1 | 2/2011 | Seo et al. | |
| 2011/0048535 A1 | 3/2011 | Nagayara | |
| 2011/0108113 A1 | 5/2011 | Arikawa | |
| 2011/0132426 A1 | 6/2011 | Kang et al. | |
| 2011/0265871 A1 | 11/2011 | Lamarche | |
| 2012/0025618 A1 | 2/2012 | Erickson, Jr. et al. | |
| 2012/0189800 A1 | 7/2012 | Fujiwara et al. | |
| 2012/0199194 A1 | 8/2012 | Lamarche et al. | |
| 2012/0199195 A1 | 8/2012 | Lamarche | |
| 2012/0199196 A1 | 8/2012 | Lamarche | |
| 2012/0276676 A1* | 11/2012 | Cornfeld | H01L 31/06875 |
| | | | 438/64 |
| 2013/0118566 A1 | 5/2013 | Jones Albertus et al. | |
| 2013/0130431 A1 | 5/2013 | Jones Albertus et al. | |
| 2013/0263920 A1* | 10/2013 | Fidaner | H01L 31/02244 |
| | | | 136/255 |
| 2013/0312817 A1* | 11/2013 | Fidaner | H01L 31/0352 |
| | | | 136/255 |
| 2014/0048128 A1 | 2/2014 | Meitl et al. | |
| 2014/0196779 A1* | 7/2014 | Fidaner | H01L 31/02244 |
| | | | 136/255 |
| 2015/0206997 A1* | 7/2015 | Fidaner | H01L 31/022441 |
| | | | 136/255 |
| 2015/0349181 A1 | 12/2015 | Fidaner et al. | |

FOREIGN PATENT DOCUMENTS

| | | |
|---|---|---|
| TW | 201322327 | 6/2013 |
| WO | 2011/137305 | 11/2011 |
| WO | 2012/106160 | 8/2012 |
| WO | 2012/106165 | 8/2012 |
| WO | 2014/144897 | 9/2014 |
| WO | 2015/138764 | 9/2015 |

OTHER PUBLICATIONS

"C10100 Oxygen-Free Copper", Anchor Bronze & Metals, Inc., accessed at <http://web.archive.org/web/20080727020042/http://www.anchorbronze.com/c10100.htm> and dated Jul. 27, 2008.

Chen et al., Journal of Vacuum Science and Technology B, 2009, vol. 27, No. 5, p. 2166.

Clawson, Materials Science and Engineering, 2001, vol. 31, p. 1-438.

Cotal et al., "III-V multijunction solar cells for concentrating photovoltaics", Energy and Environment Science, Dec. 10, 2008, pp. 174-192.

Danzilio, CS Mantech Conference, May 14-17, 2007, Austin, TX, p. 11-14.

Friedman et al., "Breakeven Criteria for the GaInNAs Junction in GaInP/GaAs/GaInNAs/Ge Four-junction Solar Cells", Progress in Photovoltaics: Research and Applications, 2002, p. 331-344.

Garcia et al., "Analysis of Tellurium As N-Type Dopant in GaInP: Doping, Diffustion, Memory Effect and Surfactant Properties", pp. 794-799, Journal of Crystal Growth 298 (2007), www.sciencedirect.com Available online Dec. 4, 2006.

Geelen et al., Epitaxial Lift-Off GaAs Solar Cell From A Reusable GaAs Substrate, pp. 162-171, Materials Science and Engineering B45 (1997).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

Jackrel et al., Dilute nitride GaInNAs and GaInNAsSb solar cells by molecular beam epitaxy, pp. 1-8, Journal of Applied Physics 101, 114916, (2007).

Janotti et. al., Mutual Passivation of Electrically Active and Isovalent Impurities in Dilute Nitrides, Physical Review Letters 100, 045505 (2008).

Ng et al., 1EV GANXAS1-X-YSBY Material For Lattice-Matched III-V Solar Cell Implementation On GAAS and GE, pp. 76-80, (2009).

(56) References Cited

OTHER PUBLICATIONS

Ptak et al., Low-acceptor-Concentration GaInNAs grown by Molecular-beam Epitaxy for High-current p-i-n solar cell applications, Journal of Applied Physics 98, 094501 (2005).
Van Kerschaver et al., Progress in Photovoltaics: Research and Applications, 2006, vol. 14, p. 107-123.
Volz et al., Optimization Of Annealing Conditions of (GaIn)(NAs) For Solar Cell Applications, pp. 2222-2228, Journal of Crystal Growth 310 (2008), www.sciencedirect.com Available online Dec. 4, 2007.
Wu et al., Band Anticrossing in Highly Mismatched III-V Semiconductor Alloys, pp. 860-869, Semiconductor Science and Technology 17 (2002).
Yamaguchi et al., "Multi-junction III-V solar cells: Current status and future potential", Solar Energy, Jul. 2005, vol. 79, Issue 1, Abstract [online]. Retrieved on Jan. 12, 2011, at URL: <http://www.sciencedirect.com/science?_ob=ArticleURL&_udi=B6V50-4DNW4BV-3&_user=10&_coverDate=07%2F31%2005&_rdoc=1&_fmt=high&_orig=search&_origin=search&_sort=d&_docanchor=&view=c&_searchStrId=1605061367&_rerunOrigin=scholar.google&_acct=C000050221&_version=1&_urlVersion=0&_userid=10&md5=d794dede36e6c739dc0c967e27d43a2&searchtype=a>.
Yu et. al., Mutual Passivation Of Group IV Donors And Nitrogen In Diluted GaNxAs1-x Alloys, pp. 2844-2846, Applied Physics Letters, vol. 83, No. 14 (Oct. 6, 2003).
Zaknoune et al., J. Vac. Sci Technol. B, 1998, vol. 16, No. 223.
International Search Report and Written Opinion corresponding to PCT/US2011/036486, dated Aug. 25, 2011, 12 pages.
International Search Report and Written Opinion corresponding to PCT/US2010/056800, dated Jan. 26, 2011, 8 pages.
International Search Report and Written Opinion corresponding to PCT/US2012/022611, dated Jun. 21, 2012, 9 pages.
International Search Report and Written Opinion corresponding to PCT/US2012/022539, dated May 23, 2012, 10 pages.
International Search Report and Written Opinion corresponding to PCT/US2011/034485, dated Aug. 3, 2011, 9 pages.
International Preliminary Report on Patentability corresponding to the PCT application No. PCT/US2011/034485, dated Nov. 15, 2012, 7 pages total.
International Search Report and Written Opinion of the International Searching Authority for PCT Application No. PCT/US2012/022539, dated May 23, 2012, 10 pages.
International Search Report and Written Opinion of the International Searching Authority for PCT Application No. PCT/US2012/022611, dated Jun. 21, 2012, 9 pages.
Non-Final Office Action dated Nov. 21, 2013 for U.S. Appl. No. 12/944,361, 11 pages.
Final Office Action dated Apr. 15, 2014, for U.S. Appl. No. 12/944,361, 13 pages.
Notice of Allowance dated Jan. 12, 2016, for U.S. Appl. No. 12/944,361, 22 pages.
Non-Final Office Action dated Dec. 19, 2012 for U.S. Appl. No. 13/224,204, 14 pages.
Non-Final Office Action dated Mar. 14, 2013 for U.S. Appl. No. 13/092,555, 12 pages.
Non-Final Office Action dated Dec. 11, 2013 for U.S. Appl. No. 13/092,555, 12 pages.
Non-Final Office Action dated Dec. 20, 2013 for U.S. Appl. No. 13/224,181, 10 pages.
Non-Final Office Action dated Aug. 1, 2013 for U.S. Appl. No. 13/224,204, 15 pages.
Non-Final Office Action dated Mar. 14, 2013, for U.S. Appl. No. 13/224,204, 16 pages.
Non-Final Office Action dated Mar. 14, 2013 for U.S. Appl. No. 13/224,232, 16 pages.
Final Office Action dated Dec. 17, 2013 for U.S. Appl. No. 13/224,232, 19 pages.
Notice of Allowance dated Jul. 8, 2014, for U.S. Appl. No. 13/224,204, 10 pages.
Final Office Action dated Aug. 1, 2014 for U.S. Appl. No. 13/092,555, 13 pages.
Notice of Allowance dated Sep. 30, 2015, for U.S. Appl. No. 13/092,555, 31 pages.
Final Office Action dated Jul. 31, 2013 for U.S. Appl. No. 13/224,181, 14 pages.
Notice of Allowance dated Dec. 4, 2014, for U.S. Appl. No. 13/224,232, 8 pages.
Non-Final Office Action dated Jul. 7, 2014 for U.S. Appl. No. 13/224,232, 19 pages.
Search Report for Application GB1700947.3, dated Feb. 13, 2017, 8 pages.
Partial International Search Report for Application No. PCT/US2017/014125, dated Apr. 4, 2017, 7 pages.
International Search Report and Written Opinion for Application No. PCT/US2017/014125, dated May 20, 2017, 19 pages.
International Search Report and Written Opinion for Application No. PCT/US2017/033325, dated Aug. 3, 2017, 14 pages.
International Search Report and Written Opinion for Application No. PCT/US2017/035243, dated Aug. 28, 2017, 15 pages.
Search Report for Taiwan Application No. TW106102414, ated Mar. 20, 2018, 1 page.

* cited by examiner

VIA ETCH METHOD FOR BACK CONTACT MULTIJUNCTION SOLAR CELLS

This application claims the benefit under 35 U.S.C. § 119(e) of U.S. Provisional Application No. 62/286,100 filed on Jan. 22, 2016, which is incorporated by reference in its entirety.

FIELD

This disclosure relates to semiconductor devices and methods for fabricating semiconductor devices. Particularly, the disclosure relates to back-contact-only multijunction solar cells and the process flows for making solar cells, including a wet etch process that removes semiconductor materials non-selectively without major differences in etch rates between heteroepitaxial III-V semiconductor layers.

BACKGROUND

Conventional multi junction solar cells have been widely used for terrestrial and space applications because of their high efficiency. Multijunction solar cells (100), as shown in FIG. 1, include multiple diodes in series connection, known in the art as junctions or subcells (106, 107, and 108), realized by growing thin regions of epitaxy in stacks on semiconductor substrates. Each subcell in a stack possesses a unique bandgap and is optimized for absorbing a different portion of the solar spectrum, thereby improving efficiency of solar energy conversion. These subcells are chosen from a variety of semiconductor materials with different optical and electrical properties in order to absorb different portions of the solar spectrum. The materials are arranged such that the bandgap of the subcells becomes progressively narrower from the top subcell (106) to the bottom subcell (108). Thus, high-energy photons are absorbed in the top subcell and less energetic photons pass through to the lower subcells where they are absorbed. In every subcell, electron-hole pairs are generated and current is collected at ohmic contacts in the solar cell. Semiconductor materials used to form the subcells include, but are not limited to, germanium and alloys of one or more elements from group III and group V on the periodic table. Examples of these alloys include, but are not limited to, indium gallium phosphide, indium phosphide, gallium arsenide, aluminum gallium arsenide, indium gallium arsenide, and dilute nitride compounds. For ternary and quaternary compound semiconductors, a wide range of alloy ratios can be used.

Solar cells are manufactured on a wafer scale using conventional semiconductor processing methods known to practitioners skilled in the art. Danzilio (CS MANTECH Conference, May 14-17, 2007, Austin, Tex., pp. 11-14) summarizes the processing steps for making a typical multijunction solar cell.

A through-wafer via (TWV) is an electrical interconnect between the top (front) and bottom (back) surfaces of a semiconductor chip. TWVs are routinely used for a variety of applications in the field of semiconductor devices including solar cells. FIG. 2A and FIG. 3A show examples of TWVs (200 and 300) for solar cells with front and back contacts. TWVs are electrically isolated from the solar cell substrate (202 and 302) and all the epitaxial regions (203 and 303), and are electrically connected to the patterned cap regions (204 and 304). The patterned cap regions are patterned such that they surround the TWV structures on the top surface of the solar cell. Front side metal pads (201 and 301) lay over patterned cap regions (204 and 304). TWVs also comprise back side metal (205 and 305), via metal (206 and 306), passivation layer (207 and 307), via contact metal region (208 and 308) and gap 209 between passivation layer 207 and back side metal 205. In some known examples of TWVs, a recess structure 309 is present in the TWV design. Methods to fabricate TWVs are known to practitioners skilled in the art of semiconductor fabrication. For example, Chen et al. (Journal of Vacuum Science and Technology B, Volume 27, Issue 5, p. 2166-2009) disclose a semiconductor device with TWVs for a high mobility electron transport device application.

TWVs are also used to provide back-contact packaging in solar cells. Back-contact cells have both positive and negative external contact pads disposed on the back surface, which allows for optimized module efficiency by increasing the packing density of solar cells. Shading losses and resistive losses are also significantly reduced. Van Kerschaver et al. (Progress in Photovoltaics: Research and Applications 2006; 14:107-123) summarizes several approaches for back-contact solar cells.

Dry etching is a routine method used in semiconductor fabrication which has found limited use in solar cell manufacturing. Dry etching involves the removal of semiconductor material by exposing the material to plasma of reactive gases in a vacuum chamber. Dry etching of heteroepitaxial layers in multijunction solar cells involves added complexity because each class of semiconductor material requires a unique etch condition. This complexity causes a slower net etch rate and a bottleneck in manufacturing. As etching proceeds across multiple layers of heterogeneous semiconductor materials, re-deposition of etched-off material causes rough sidewalls and is unavoidable. A mask is used to protect wafer areas where etching is not required. A photosensitive polymer is typically used as the mask, but a photosensitive polymer mask cannot withstand the long etch times and high heat required for dry etching. The photosensitive polymer mask is often destroyed, leading to pitting and significantly to the generation of rough surfaces, which complicates subsequent sidewall passivation processing and decreases reliability of manufactured devices. FIG. 4A depicts a schematic of a wafer cross-section imaged by scanning electron microscopy, damaged with pitting and rough sidewall surfaces (408 and 409). The device shown in FIG. 4A includes cover glass 407, front side metal pad 406, ARC 405, heteroepitaxial layer 403, substrate 402, patterned cap regions 404, and back side 401 of substrate 402. The sidewall 409 of heteroepitaxial layer 403 is characterized by a rough surface including pitting and/or undercutting resulting from the dry etch. Pitting 408 is also shown on the back side surface 401 of substrate 402, which can also be caused by the dry etch. Alternative masking methods such as dielectric hard masks can be used in place of a photosensitive polymer, but these masks require elaborate downstream steps for removal from the wafer. Dry etching also involves expensive equipment setup and maintenance. In summary, dry etching involves the following complications:

1. electroplating or electrografting to protect wafer areas where etching is not desired, requiring expensive and specific equipment;
2. low processing throughput and longer processing time because dry etching can be carried out on only a few wafers at a time;
3. difficulty in controlling etch rate as well as etch stop, leading to insufficient etching or over-etching;
4. uneven etching of heteroepitaxial III-V semiconductor layers results in pitting and rough sidewall surfaces, which complicate subsequent sidewall passivation;

5. higher possibility of device failure due to insufficient sidewall passivation;
6. more chemical, water, and energy consumption during fabrication; and
7. higher cost from equipment procurement and maintenance.

Wet etching, another method for removing semiconductor material by using chemicals in liquid phase, is not without shortcomings. Typically, wet etchants used for etching one class of semiconductor materials is selective and will not etch certain other classes of semiconductor materials. A comprehensive list of wet etchants, etch rates and selectivity relationships was published by Clawson, Materials Science and Engineering, 31 (2001) 1-438. The selectivity of a wet etchant may also depend on alloy concentration of the compounds. Consequently, etching heteroepitaxial layers can require application of multiple wet etch chemistries. Using multiple applications of different wet etchants due to selectivity typically results in jagged, non-smooth, and/or irregular through-wafer via sidewalls (as shown in FIG. 4A). This is observed in solar cell fabrication where different etch chemistries are used for each class of semiconductor material in the heteroepitaxial layers, resulting in distinctively different etch profiles and rough sidewall surfaces throughout the wafer. Zaknoune et al., J. Vac. Sci. Technol. B 16, 223 (1998) reported a wet etching method that is nonselective for III-V phosphides and arsenides as an alternative to using multiple wet etchants. Although the method is nonselective, the etching of gallium arsenide results in very rough morphology and involves an etch rate 10 times greater than the etching of aluminum gallium indium phosphide. Zaknoune et al. describes a system with one layer of epitaxy, such as that found in heterojunction bipolar transistors (HBT), quantum well lasers (QWL) and high electron mobility transistors (HEMT). The Zaknoune et al. method does not address any sidewall problem related to heteroepitaxial layers that is characteristic of multijunction solar cells.

Typically, rough/jagged through-wafer via sidewalls complicate subsequent sidewall passivation, leading to an increase in device failures and lower fabrication yield. In addition, the use of multiple etchants has other disadvantages compared to single-etch chemistries, including, for example:
1. increased difficulty in controlling the etch rate and undesirable lateral undercutting of layers;
2. uneven etching of different semiconductor layers and increased difficulty in subsequent sidewall passivation processing;
3. higher possibility of device failure due to insufficient sidewall passivation;
4. longer processing time due to complications and unpredictability inherent in the method;
5. more chemical, water, and energy consumption during fabrication; and
6. more chemical waste generation.

The abovementioned conventional processes have hindered cost-effective fabrication of multijunction solar cells. There were attempts to explore non-selective etchants and a couple examples are briefly described. Zaknoune et. al. (J. Vac. Sci. Technol. B 16, 223, 1998) reports an etching procedure that is nonselective for gallium arsenide and aluminum gallium indium phosphide, where the aluminum gallium indium phosphide quaternary compound has 35% aluminum phosphide, 15% gallium phosphide, and 50% indium phosphide. The etching procedure described by Zaknoune et al. uses a diluted solution of hydrochloric acid, iodic acid, and water to etch 300 nm of the quaternary compound grown on a gallium arsenide substrate using a photosensitive polymer mask. The main application areas described in the paper by Zaknoune et al. are heterojunction bipolar transistors (HBT), various quantum well lasers (QWL), and high electron mobility transistors (HEMT) for which large conduction and valance band discontinuities are required. These devices are majority carrier devices in which the large bandgap materials are typically used as barrier materials for majority carriers. Zaknoune et al. describes a system with one layer of epitaxy and do not recognize any sidewall problem related to multilayer epitaxy that is characteristic of solar cells.

The device requirements for multijunction solar cells are significantly different than for HBTs, QWLs, and HEMTs, largely because multijunction solar cells are minority carrier devices. Consequently the procedure described by Zahnoune et al. has no direct application to etching multijunction solar cell structures, which include a wide variety of semiconductor materials with a wide range of bandgaps (for example, from 0.67 eV to 2.25 eV).

The present disclosure describes a TWV fabrication method that overcomes complications with existing methods. The various advantages include the following:
1. when anti-reflective coating (ARC) is deposited, as part of routine solar cell fabrication, a pattern is added where the TWV is to be constructed, i.e. the ARC is used as a dielectric etch stop between the semiconductor and the metal pads on top of the wafer. This additional function of ARC simplifies TWV fabrication by eliminating the application of an extra etch stop;
2. standard manufacturing processing steps are employed, including photolithography, wet etching and thin film evaporation;
3. significant cost reduction due to the use of inexpensive equipment, chemicals and methods;
4. processing throughput is higher because multiple wafers can be etched at the same time and fewer etching process steps are required;
5. areas of wafer that need to be protected from etching can be protected by a photosensitive polymer, employing a lower cost material and simpler method than electroplating photoresist or electrografting;
6. smooth, 100% passivated TWV walls, which improves manufacturing yield by lowering the risk of device failure; and
7. a thinner substrate results from these processing steps, making the solar cells lighter and appropriate for space applications.

SUMMARY

According to the present invention, methods of forming a semiconductor device are disclosed, comprising the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and at least one additional subcell overlying the first subcell; and at least one of the first subcell or the at least one additional subcell comprises an alloy comprising one or more elements from group III of the periodic table, N, As, and an element selected from Sb, Bi and a combination thereof; a plurality of patterned cap regions overlying the heteroepitaxial layer; an anti-reflective coating overlying the heteroepitaxial layer; and; a corresponding metal region overlying each of the plurality of patterned cap regions; bonding a cover glass to the front side of the semiconductor wafer with an optically clear adhesive; removing a desired amount from the semiconductor wafer by a thinning of the substrate region from the back side of the semiconductor wafer; patterning the back side of the semiconductor wafer with a back etch through-wafer via pattern; etching from the back side of the semiconductor wafer a plurality of through-wafer vias using a single wet etchant mixture, wherein each of the plurality of through-wafer vias extends from the back side of the semiconductor wafer to the anti-reflective coating overlying the heteroepitaxial layer; removing the anti-reflective coating to expose a bottom side of the corresponding metal region with a subsequent wet etching method, wherein the subsequent wet etching method is specific for the removal of the anti-reflective coating; depositing a passivation liner on the through-wafer via walls with standard deposition techniques; depositing a resist pattern on the back side of the semiconductor wafer for back side metal isolation, wherein the resist pattern underlays the passivation liner; depositing a metal on the back side of the semiconductor wafer and on the through-wafer via; and removing the resist pattern and a sacrificial metal.

According to the present invention, methods of forming a semiconductor device are disclosed, comprising the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and an at least one additional subcell overlying the first subcell; at least one subcell comprises an alloy comprising one or more elements from group III of the periodic table, N, As, and an element selected from Sb, Bi and a combination thereof; and a cap layer overlying the heteroepitaxial layer; patterning the front side of the semiconductor wafer with a front etch through-wafer via pattern; etching from the front side of the semiconductor wafer a plurality of through-wafer vias using a single wet etchant mixture, wherein, each of the plurality of through-wafer vias extends from the front side surface of the semiconductor wafer into the substrate; patterning the plurality of patterned cap regions on the heteroepitaxial layer on the front side of the semiconductor wafer; depositing an anti-reflective coating overlying the heteroepitaxial layer and the through-wafer via sidewalls; removing, from the front side, the anti-reflective coating from the bottom of the through-wafer via holes; depositing a front side resist pattern from the front side of the semiconductor wafer, wherein the front side resist pattern guides metal layer lithography; and depositing a metal on the front side of the semiconductor wafer, on the through-wafer via sidewalls and on the through-wafer via bottom.

According to the present invention, semiconductor devices are disclosed comprising: a heteroepitaxial layer, further comprising an alloy comprising one or more elements from group III of the periodic table, N, As, and an element selected from Sb, Bi and a combination thereof; and a plurality of through-wafer vias characterized by the absence of pitting on smooth sidewall surfaces formed by a method provided by the present disclosure.

According to the present invention, through-wafer via structures are disclosed comprising: a substrate comprising a back side and a front side; a heteroepitaxial layer overlying the front side of the substrate; an antireflection coating overlying a first portion of the heteroepitaxial layer; a patterned cap region overlying a second portion of the heteroepitaxial layer; a front side metal pad overlying and electrically connected to the patterned cap region, wherein the front side metal pad comprises a bottom surface; and a through-wafer via extending from the back side of the substrate to the front side metal pad, wherein the through-wafer via comprises sidewalls; a passivation liner overlying a portion of the back side of the substrate and the sidewalls of the through-wafer via; and a metal layer overlying the passivation liner and the bottom surface of the front side metal pad within the through-wafer via.

According to the present invention, through-wafer via structures are disclosed comprising: a substrate comprising a back side and a front side; a heteroepitaxial layer overlying the front side of the substrate; an anti-reflection coating overlying a first portion of the heteroepitaxial layer; a patterned cap region overlying a second portion of the heteroepitaxial layer; a front side metal overlying a portion of the anti-reflection coating and the patterned cap region; a through-wafer via extending from the back side of the substrate through a portion of the anti-reflection coating; a passivation liner overlying side walls of the through-wafer via; a metal seed layer overlying the passivation liner and plugging the bottom of the through-wafer via; and a metal overlying the metal seed layer and filling the through-wafer via.

According to the present invention, semiconductor devices are disclosed comprising a through-wafer via structure provided by the present disclosure.

According to an aspect of the invention, a through-wafer via structure comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a back surface solder pad underlying a portion of and electrically connected to the back substrate surface; a front surface solder pad underlying and insulated from the back substrate surface; and a through-wafer-via interconnecting the front surface solder pad and the front surface contact.

According to an aspect of the invention, a semiconductor device comprises a plurality of the through wafer via structures according to the invention.

According to an aspect of the invention, a method of fabricating a through wafer via structure, comprises: providing a semiconductor wafer, wherein the semiconductor wafer comprises: a substrate comprising a front substrate surface and a back substrate surface; a heteroepitaxial layer overlying the front substrate surface; a front surface contact overlying and electrically connected to a portion of the heteroepitaxial layer; an optical adhesive overlying the front surface contact and the heteroepitaxial layer; and a coverglass overlying the optical adhesive layer; and thinning the substrate.

According to an aspect of the invention, a through wafer via structure comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a passivation layer underlying a portion of the back substrate surface; a back metal pad underlying a portion of the passivation layer; a through-wafer-via electrically interconnecting the front metal contact and the back metal pad; and a backside metal electrically connected to the back substrate surface.

According to an aspect of the invention, a semiconductor device comprises a plurality of the through wafer via structures according to the invention.

According to an aspect of the invention, a method of fabricating a through wafer via structure comprises: providing a semiconductor wafer, wherein the semiconductor wafer comprises: a substrate having a front substrate surface and a back substrate surface; a heteroepitaxial layer overlying the front substrate surface; and a patterned cap region overlying a first portion of the heteroepitaxial layer; etching a through-wafer-via extending from the heteroepitaxial layer to within the substrate; depositing an antireflection coating on a second portion of the heteroepitaxial layer and on a sidewall and a bottom of the through-wafer-via; etching the antireflection coating on the bottom of the through-wafer-via to expose the substrate; depositing a front surface contact overlying at least a portion of the patterned cap region, the antireflection coating within the patterned cap region, the sidewalls of the through-wafer-via, and the bottom of the through-wafer-via; applying an optical adhesive overlying the front surface contact, the patterned cap region, and the antireflection coating; applying a coverglass overlying the optical adhesive; and thinning the substrate.

BRIEF DESCRIPTION OF DRAWINGS

The drawings described herein are for illustration purposes only. The drawings are not intended to limit the scope of the present disclosure.

FIGS. 5 and 17-26 illustrate a process flow for certain embodiments provided by the present disclosure.

Figure 1:
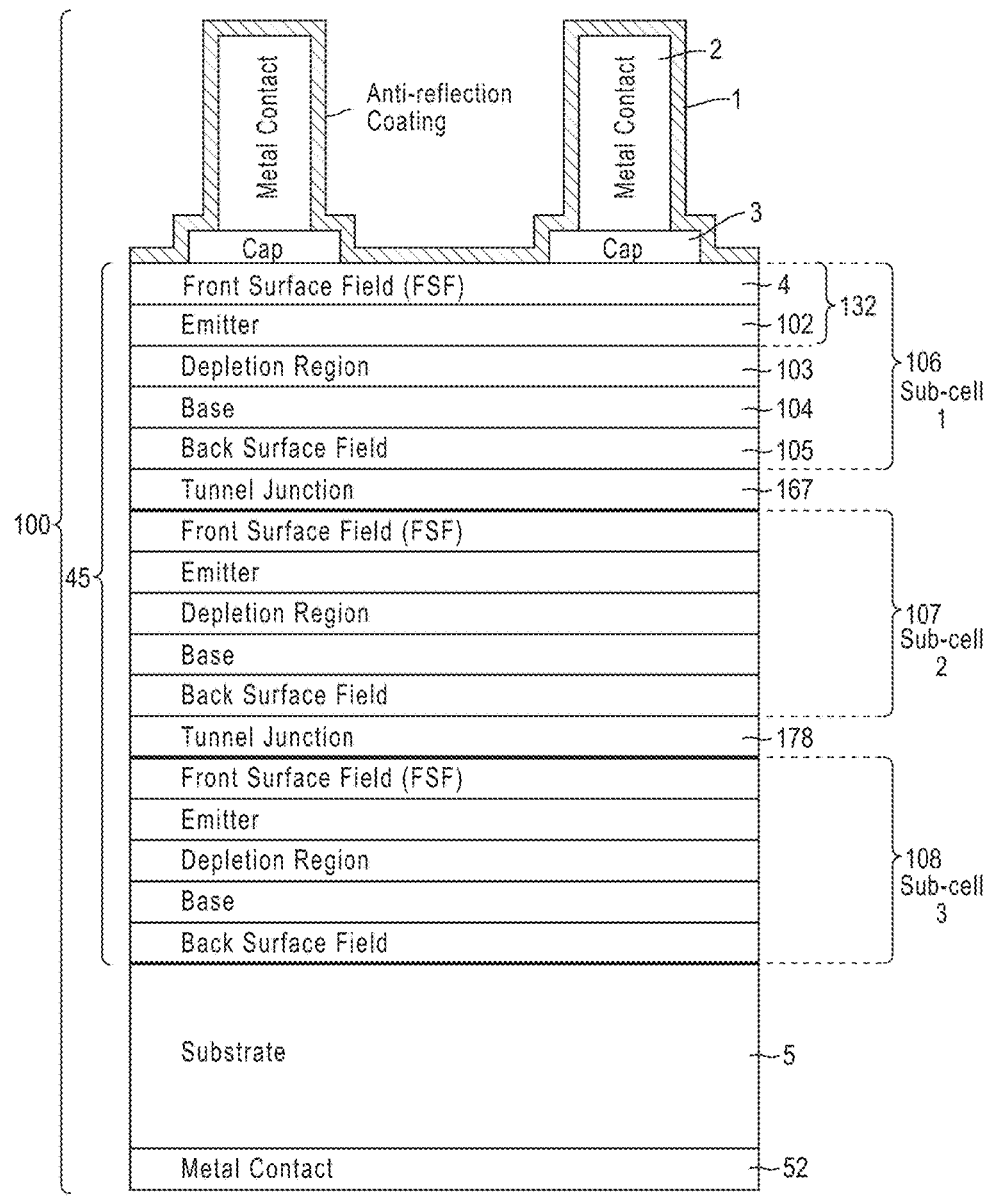
FIG. 1 is a cross-section of a multijunction solar cell.
Figure 2A:
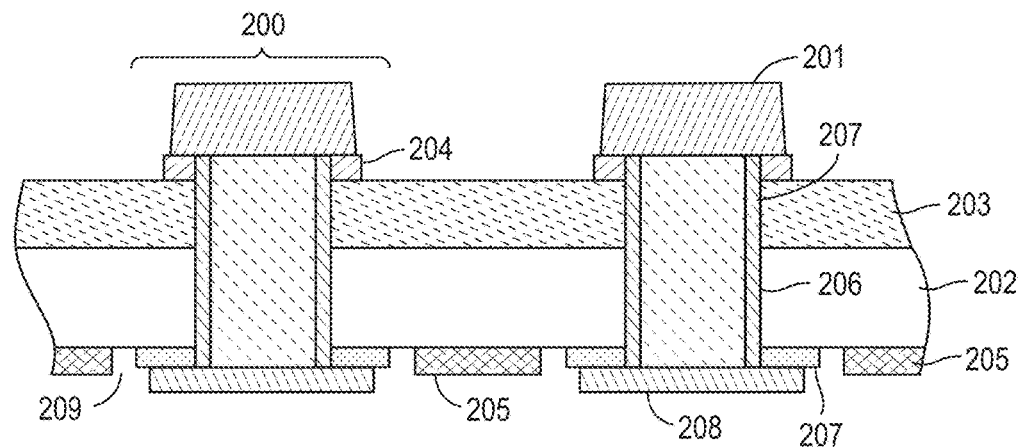
FIG. 2A is a cross-section of a multijunction solar cell with TWVs fabricated by dry etching.
Figure 2B:
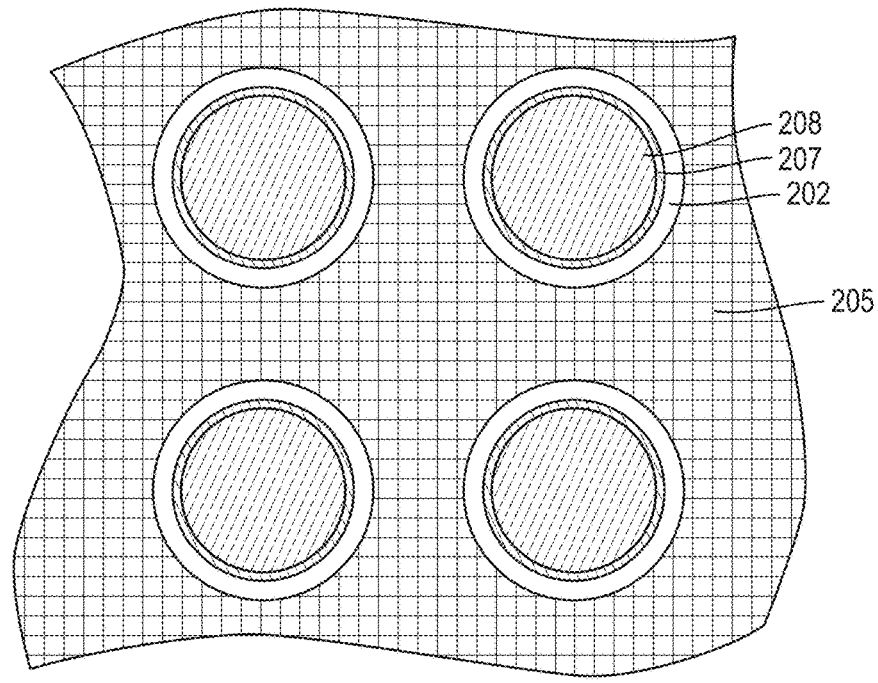
FIG. 2B shows a bottom view of the multijunction solar cell s shown in FIG. 2A.
Figure 3A:
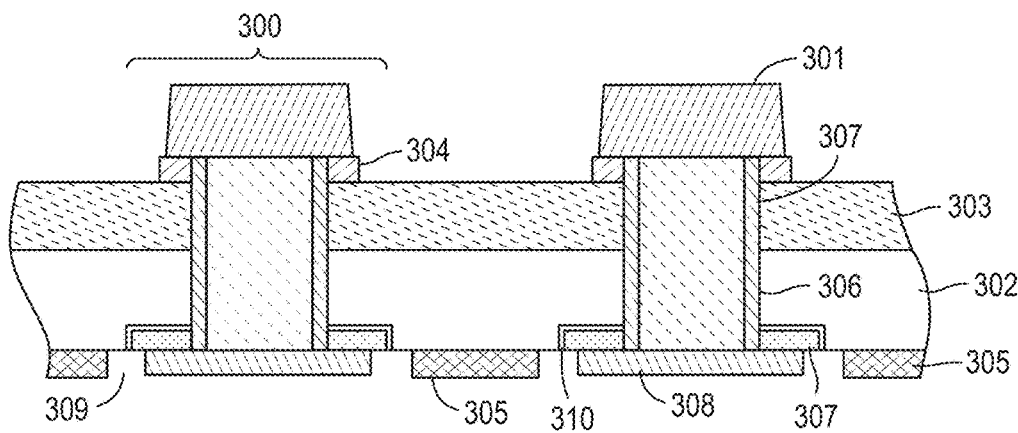
FIG. 3A is a cross-section of a multijunction solar cell with TWVs fabricated by dry etching.
Figure 3B:
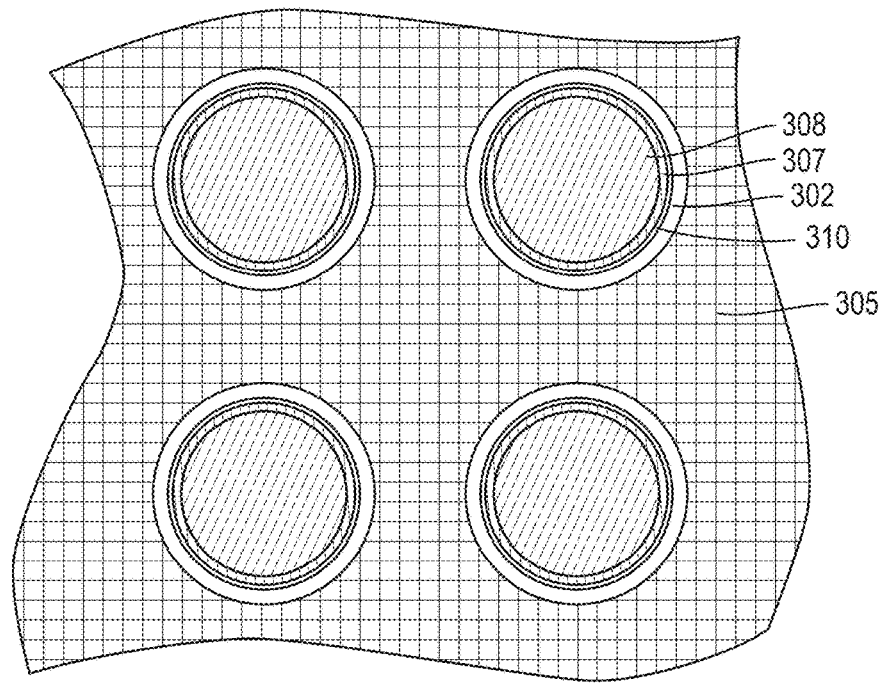
FIG. 3B shows a bottom view of the multijunction solar cell shown in FIG. 3A.

Reference is now made in detail to certain embodiments of the present disclosure. While certain embodiments of the present disclosure are described, it will be understood that it is not intended to limit the embodiments of the present disclosure to the disclosed embodiments. To the contrary, reference to embodiments of the present disclosure is intended to cover alternatives, modifications, and equivalents as may be included within the spirit and scope of the embodiments of the present disclosure as defined by the appended claims.

DETAILED DESCRIPTION

Single step wet etch processes are described to create a semiconductor device that requires back contacts. Specifically, TWVs for back-contact multijunction solar cells are fabricated with this wet etch method. TWVs are fabricated that are electrically isolated from the solar cell substrate and all epitaxial regions, except for the patterned cap regions. The method of wet etch chemistry employed removing semiconductor materials non-selectively without major differences in etch rates between different heteroepitaxial layers. This is useful for multijunction solar cells, which comprise multiple heterogeneous semiconductor layers epitaxially grown on the semiconductor substrate. Multijunction solar cells thus formed lack pitting on the wafer surfaces and on the TWV sidewalls, and have smooth sidewall surfaces within the TWVs. This process employs standard wafer batch processing, significantly reduces fabrication complexity and cost, increases processing throughput, and improves device performance and reliability by ensuring complete passivation of TWV walls.

The process steps described herein can be modified or adapted provided that the removal of semiconductor material in exposed areas is achieved using a single-step wet etch process. It is to be understood that additional process steps inserted in all semiconductor processes that require TWV fabrication.

In certain aspects of the invention, TWVs can be etched from the back side of a semiconductor wafer. The semiconductor wafer has front side metal pads, patterned cap regions, metal regions that lay over each patterned cap region, and an ARC that result from front side wafer processing. The front side of the semiconductor wafer can also be bonded to cover glass with an optically clear adhesive. The semiconductor can be thinned from its back side. TWV holes can be etched from the back side of the semiconductor wafer so that the TWVs extend from the back side surface of the semiconductor wafer to the ARC overlying the top of the heteroepitaxial layer. Wafer areas, where etching is not desired, can be protected by resist patterns. Then, multiple layers of semiconductor material can be wet etched where TWVs are desired; etching can be carried out in a single step with wet chemistry that may comprise the use of an iodic acid-hydrochloric acid mixture. The ARC can serve as a dielectric etch stop and can protect the front side metal pad from being etched. The ARC can then be removed to expose the bottom side of the front metal pads. A passivation layer can subsequently be deposited over the smooth TWV sidewalls. This can be followed by the deposition of a metal isolation resist pattern, protecting semiconductor wafer areas where metal is not required. Then, metal can be deposited on the bottom of the TWV and on the sidewalls of the TWV and on the back side of the wafer. Finally, the metal isolation resist pattern and sacrificial metal can be removed.

In another aspect of the invention, TWVs can be etched from the front side of a semiconductor wafer. The semiconductor wafer has a cap layer overlying the heteroepitaxial layer. TWV holes can be etched from the front side of the semiconductor wafer into the substrate layer using a single-step wet chemistry that may include—the use of an iodic acid-hydrochloric acid mixture. Wafer areas where etching is not desired can be protected by resist patterns. Then, patterned cap regions can be formed from the cap layer. ARC, which functions as a passivation layer, can be applied on the front side of the semiconductor wafer on regions surrounding the patterned cap regions as well as on the smooth surfaces of the TWV holes. The ARC that lines the bottom surface of TWV holes can be removed to expose the substrate. Then, metal can be deposited on the TWVs and on the front side of the semiconductor wafer, except on semiconductor wafer areas where metal is not desired and the semiconductor wafer can be protected by another resist pattern. This resist pattern can be removed and gold can be deposited to fill the TWVs. Gold can be deposited by electroplating. The semiconductor wafer can be mounted on cover glass with optically clear adhesive. Then, from the back side, the semiconductor wafer can be thinned and a passivation layer can be patterned onto this back side surface with a hard baking step. This can be followed by metal deposition, guided by a metal isolation resist pattern, on the back side of the semiconductor wafer. Finally, the metal isolation resist pattern and sacrificial metal can be removed.

Semiconductor devices formed using the single-step wet etch processes described lack pitting on the wafer surfaces as well as on the TWV sidewalls. Pitting morphology is typical if dry etching is employed to fabricate TWVs. The TWV sidewalls fabricated by this single-step wet etch method also have significantly smooth sidewall surfaces. Semiconductor devices formed by this method include back-contact-only multijunction solar cells.

Figure 28:
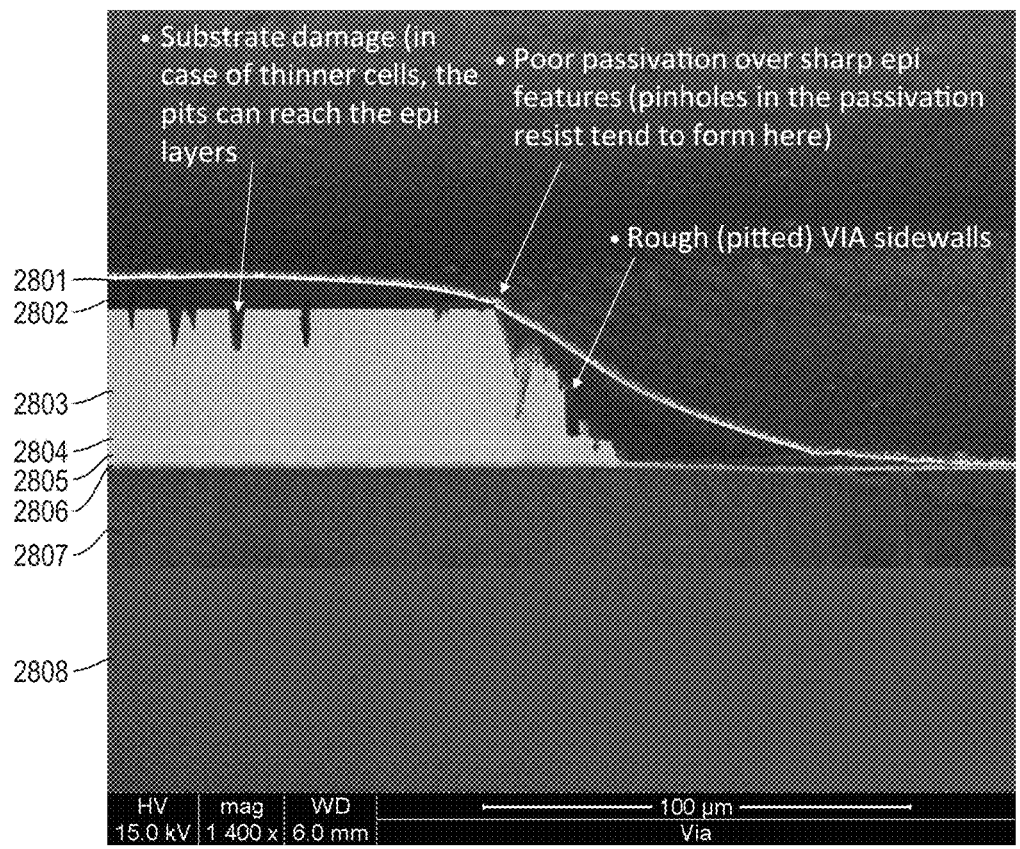
FIG. 28 shows a cross-sectional view of a multijunction solar cell with a TWV fabricated using a dry etch.

SEM (scanning electron microscopy) images showing cross-sections of TWVs fabricated using dry etch methods and fabricated using wet etch methods provided by the present disclosure are provided in FIGS. 28-30.

FIG. 28 shows a cross-section schematic view of a multijunction solar cell structure with a TWV fabricated using a dry etch process, including back side via metal 2801, passivation layer 2802, GaAs substrate 2803, bottom subcell 2804, middle subcell 2805, top subcell and contact layers 2806, adhesive 2807, and cover glass 2808. The surface of the GaAs substrate is characterized by pitting due to compromise of the etch mask. The side wall of the via is also rough and pitted. The rough surface result in the passivation layer is not completely conformal. The purpose of the passivation layer is to electrically isolate the TWV metal from the semiconductor layers such as the substrate and the heteroepitaxial layers. A high quality passivation layer will be conformal to the underlying layer such as the substrate and the side wall of the TWV and will be free of pinholes. In FIG. 28 there is poor passivation over the sharp edges of the side walls and the pits in the substrate can reach the heteroepitaxial layers.

Figure 29A:
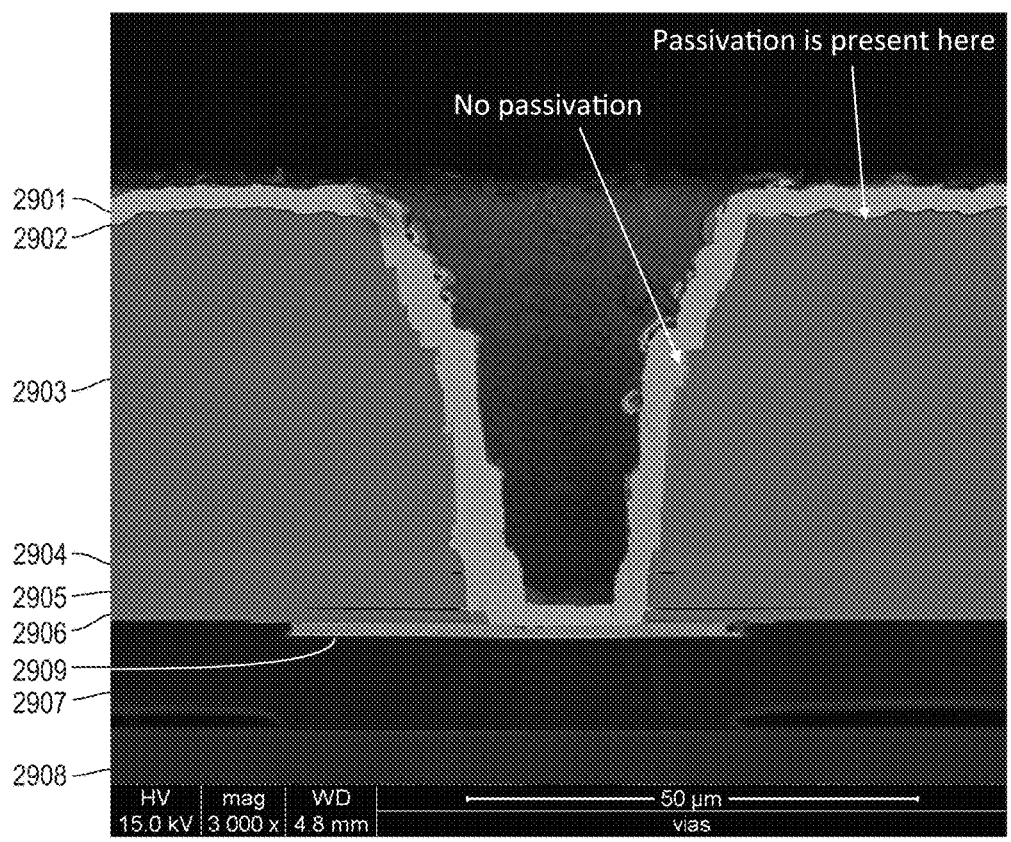
FIGS. 29A-29C show cross-sectional views of TWVs fabricated using a dry etch.
Figure 29B:
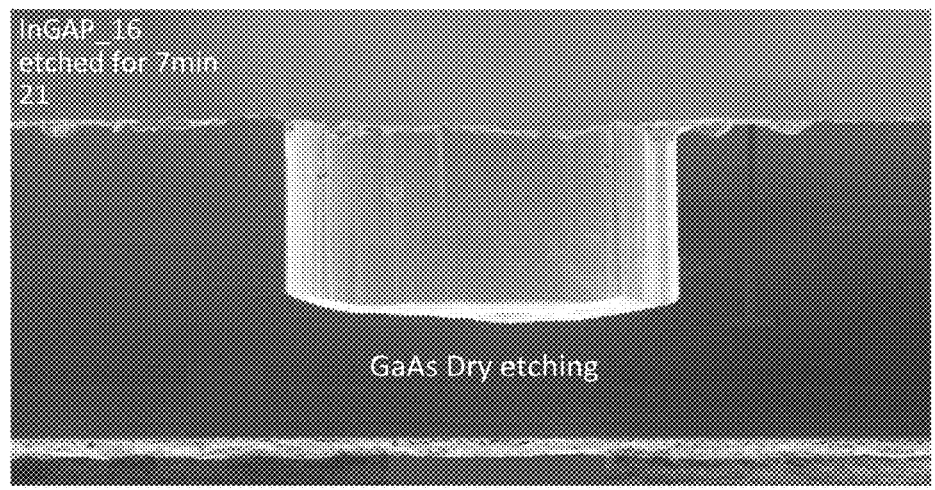
Figure 29C:
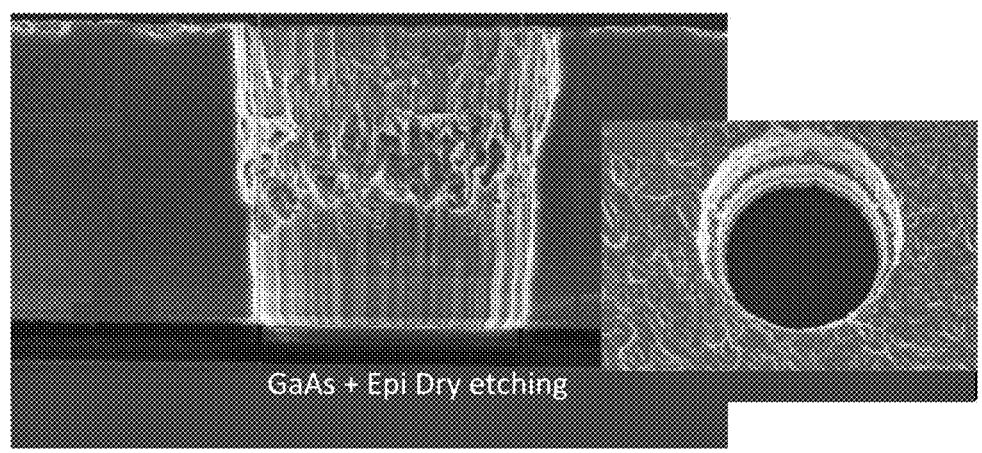

FIGS. 29A-29C also show cross-sections of TWV vias fabricated using dry etch methods. FIG. 29A shows electroplated back side metal 2901, passivation layer 2902, GaAs substrate 2903, bottom subcell 2904, middle subcell 2905, top subcell and contact layers 2906, adhesive 2907, cover glass 2908, and top side metal pad 2909. There is no passivation on the rough side wall surfaces. FIG. 29B shows that dry etching can produce smooth side walls in a GaAs substrate; however, as shown in FIG. 29C, a dry etch of both GaAs and a heteroepitaxial layer produces rough side wall surfaces that are difficult to passivate. FIG. 29C shows both a cross-sectional and a top view of a TWV structure of GaAs and heteroepitaxial layers.

For the dry etch TWV structures, because the post-etch substrate and via wall topography is rough and/or pitted, the passivation layer coating quality is poor, especially around the via edges where the passivation thickness is less than 1 µm and there are a large number of pinholes in the passivation layer. These points serve as a source for electrical shorting. Dry etching also generates etch mask residue such as burned resist that cannot be removed from the wafer without employing harsh cleaning and processing methods that would compromise the via structure. The burned resist results from the prolonged dry etch of the III-V heteroepitaxial stack and tends to accumulate around the TWV openings and also contributes to the formation of pinholes in the passivation coating.

Figure 30A:
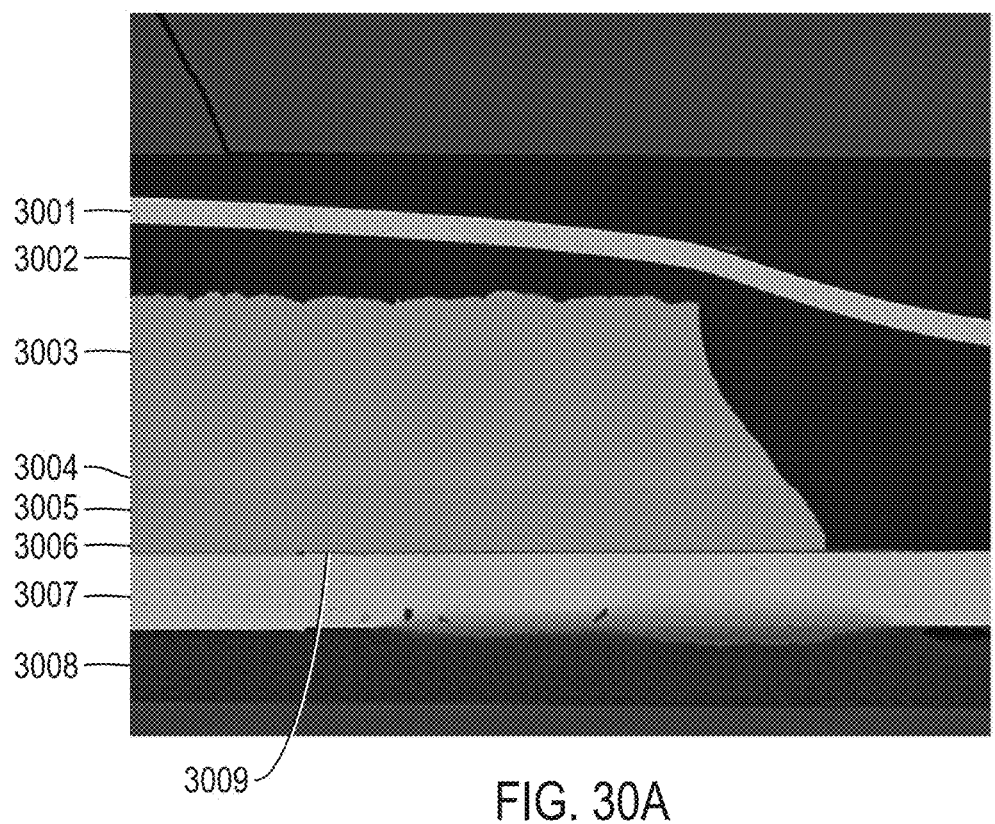
FIGS. 30A-30C shows cross-sectional views of a multijunction solar cell with a TWV fabricated using a wet etch method provided by the present disclosure.
Figure 30B:
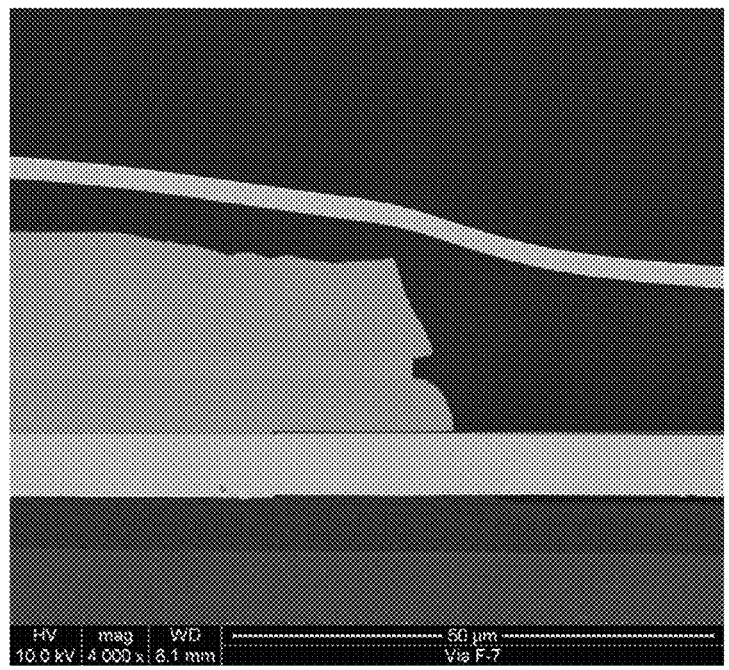
Figure 30C:
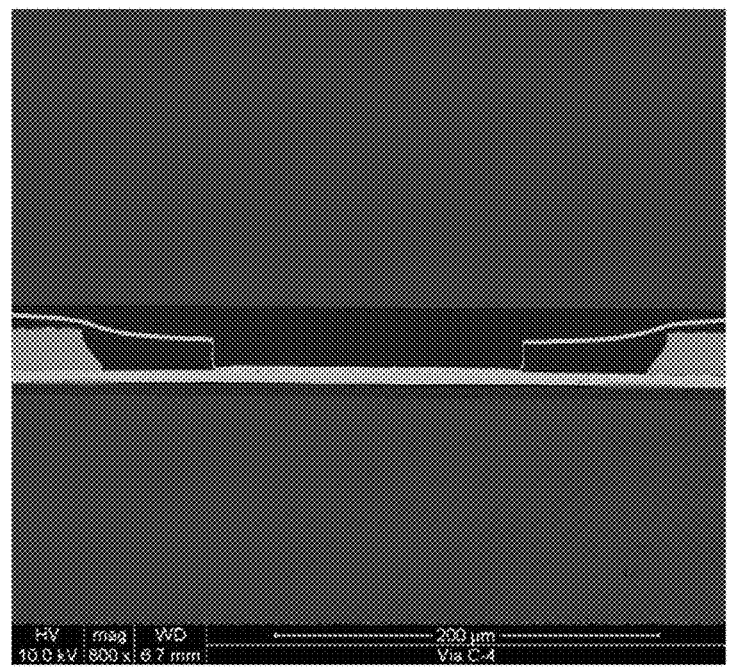

FIGS. 30A-30C show cross-sectional views of TWVs prepared using wet etch methods provided by the present disclosure. FIG. 30A shows deposited back side metal 3001, passivation layer 3002, GaAs substrate 3003, bottom subcell 3004, middle subcell 3005, top subcell and contact layers 3006, optically clear adhesive 3007, cover glass 3008, and ARC etch stop 3009. As shown in FIG. 30A, the top surface of the substrate and the side wall of the TWV are smooth and free of pitting and undercutting. The passivation layer conformably coats the surfaces that were etched using the iodic acid wet etch method provided by the present disclosure. The wet etched surfaces can comprise traces of iodine. FIG. 30B shows a cross section with some lateral undercutting of the heteroepitaxial layer but with sufficiently smooth surfaces that the passivation layer conformally coats the side wall of the TWV. FIG. 30C shows another view of a TWV structure fabricated using the iodic acid wet etch method provided by the present disclosure. FIG. 30C also shows the bottom of the via metal in the TWV structure. The passivation thickness is 3 µm at the edges of the TWV. As shown in these figures, because the substrate and TWV surfaces are smooth and free of post-etch contamination, the passivation coating quality is high and is 100% conformal.

In the following detailed description, reference is made to the accompanying drawings that illustrate specific embodiments.

As shown in FIG. 1, multijunction solar cells 100 can include a substrate 5, back metal contact 52, top metal contact 2 including cap regions 3 and heteroepitaxial layers 45 forming the subcells. The multijunction solar cell in FIG. 1 includes three subcells 106, 107, and 108. Each subcell can comprise a front surface filed 4 and emitter 102 forming element 132, depletion region 103, base 104, back surface field 105, and tunnel junction 167. An ARC can cover the top surface of the multijunction solar cell.

At least one of the subcells can comprise a dilute nitride subcell. Examples of dilute nitride subcells include GaInNAsSb, GaInNAsBi, GaInNAsSbBi, GaNAsSb, GaNAsBi, and GaNAsSbBi.

The process flow described herein is merely an example. Other process flows with different steps can be used to achieve TWVs on semiconductor material such as multijunction solar cells.

Figure 5:
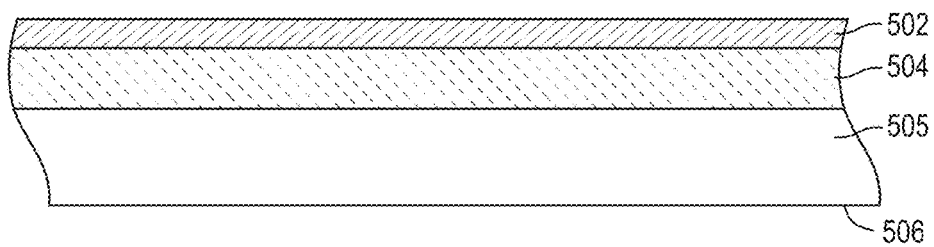
FIGS. 5-14 illustrate a process flow for certain embodiments provided by the present disclosure.
Figure 6:
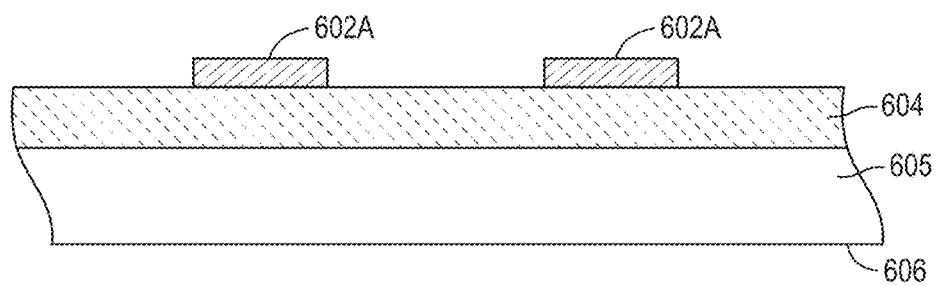
Figure 7:
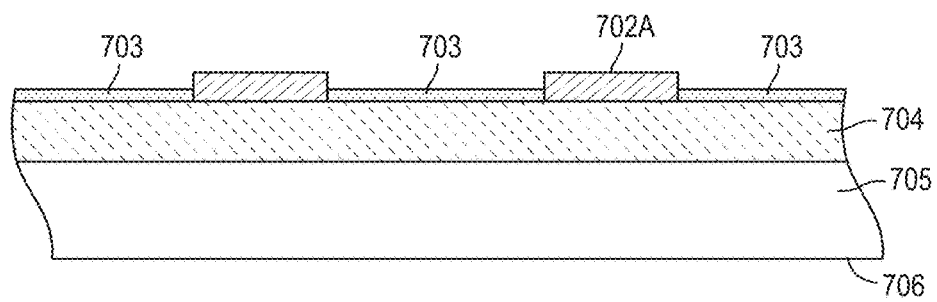
Figure 8:
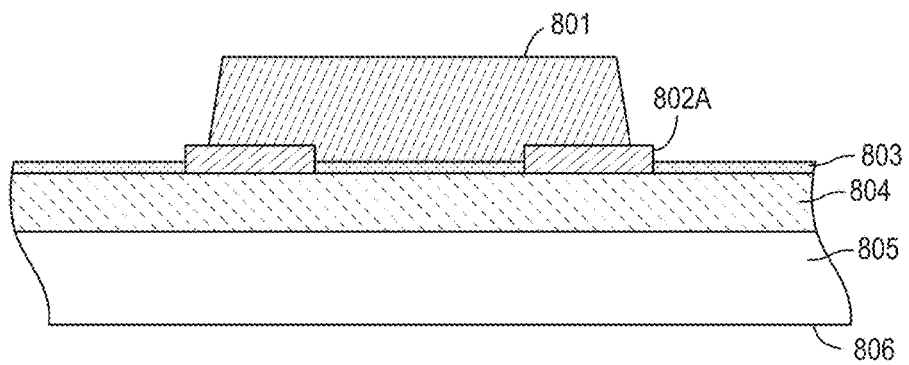
Figure 9:
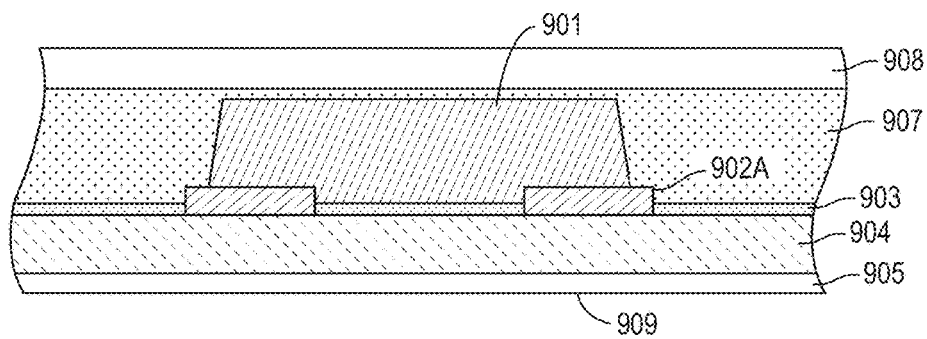
Figure 10A:
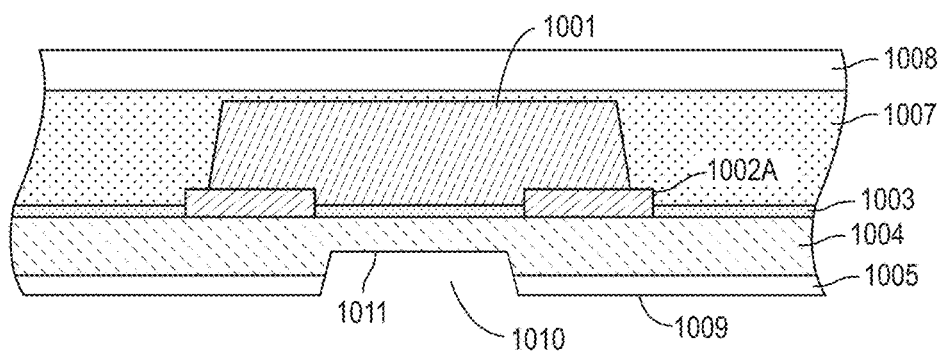
Figure 10B:
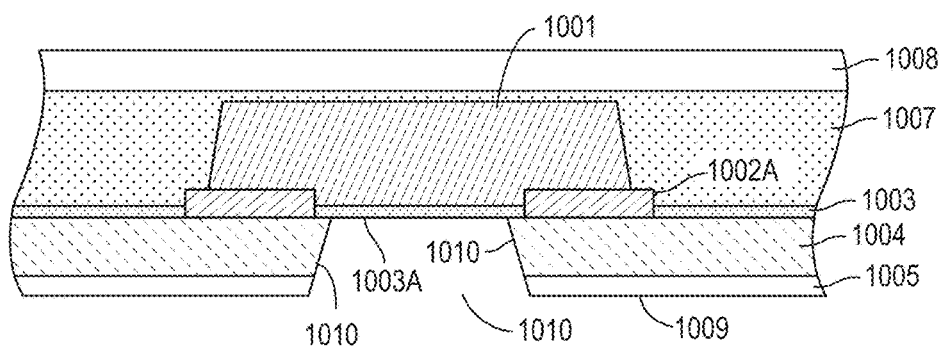
Figure 11:
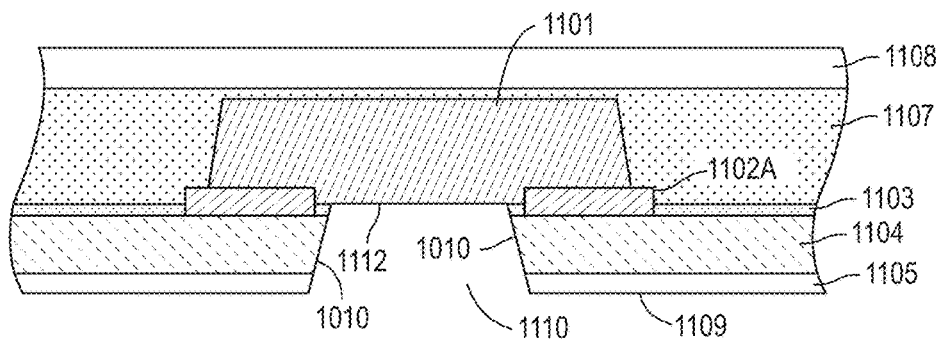
Figure 12:
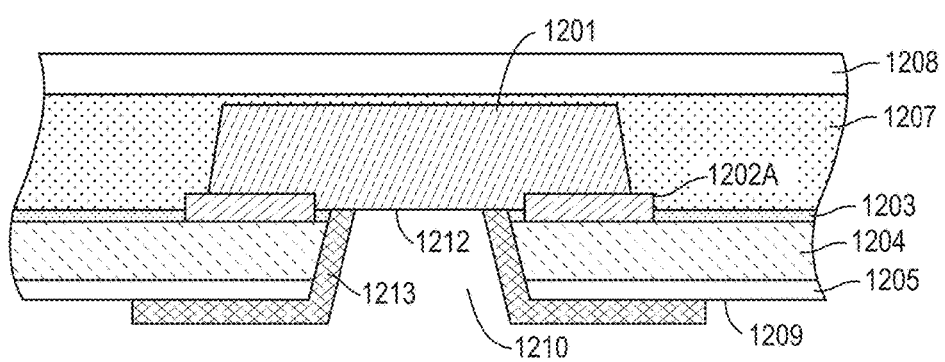
Figure 13:
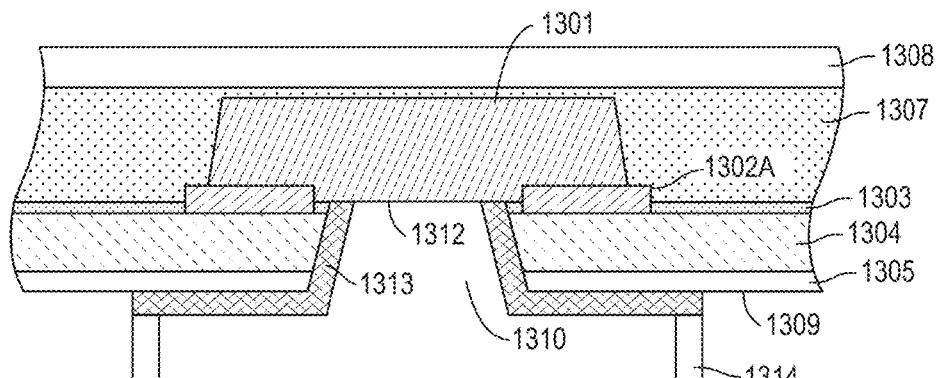
Figure 14:
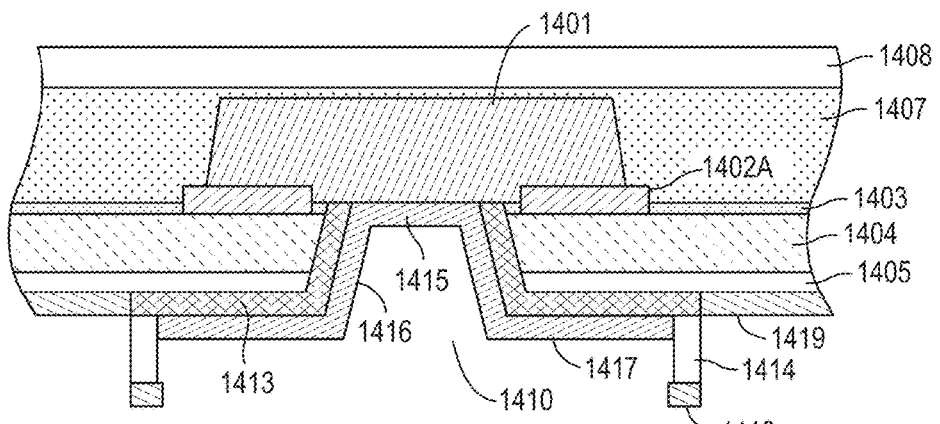
Figure 15:
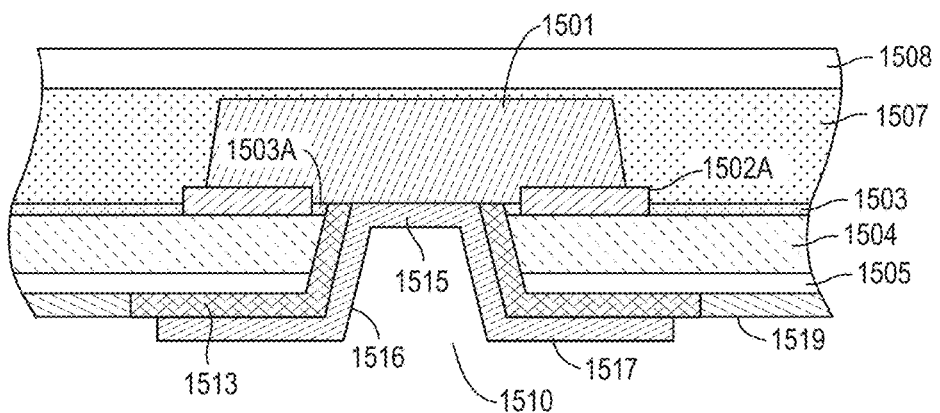
FIG. 15 is a cross-section of a multijunction solar cell with a TWV fabricated using the method illustrated in FIGS. 5-14.

FIGS. 5-15 illustrate an aspect of the invention that associated with etching TWVs from the back side of a semiconductor wafer in the fabrication of a back-contact solar cell. FIGS. 5-8 show steps involved in front side processing. FIGS. 8-15 show steps associated with back side processing, including the wet etch steps provided by the present disclosure. The process steps and final product described can be modified by one skilled in the art to accommodate a wide variety of semiconductor devices; the steps and final product are not limited to solar cells and are applicable to other semiconductor devices and in particular to minority carrier devices. The semiconductor wafer cross-sections shown in FIGS. 5-15 can be summarized as follows: FIG. 5 shows a heteroepitaxial layer on an unmodified substrate; FIG. 6 shows a wafer after contact cap layer patterning; FIG. 7 shows a wafer following application of an ARC; FIG. 8 shows a wafer following application of a front side metal pad; FIG. 9 shows a wafer after wafer bonding, back-grinding and wet etch back-thinning; FIGS. 10A and 10B show a wafer after via hole lithography and wet etch; FIG. 11 shows a wafer after via etch stop (ARC/dielectric) removal; FIG. 12 shows a wafer after passivation layer patterning and hard bake; FIG. 13 shows a wafer after back side and via-metal isolation lithography; FIG. 14 shows a wafer after back side and TWV-metal deposition; and FIG. 15 shows a completed device after metal lift off (TWV metal and back side metal separation.)

A semiconductor wafer can first undergo front side processing (FIGS. 5-8). As shown in FIG. 5, a semiconductor wafer can comprise a substrate layer 505 and the back side 506 of the wafer, and a heteroepitaxial layer 504 overlying the substrate layer 505. Materials used to form the substrate include, for example, germanium, gallium arsenide, alloys of germanium, and alloys of gallium arsenide. Materials used to form the heteroepitaxial layer include, for example, alloys of one or more elements from group III and group V on the periodic table, such as indium gallium phosphide, indium phosphide, gallium arsenide, aluminum gallium arsenide, indium gallium arsenide, and dilute nitride compounds. FIGS. 5-6 show cap region 502 and patterned cap regions 602A that are formed on the front side of the semiconductor wafer, overlying the heteroepitaxial layer (504 and 604). The patterned cap regions 602A may be patterned in a disk shape, but can also be patterned in a variety of geometric configurations, as well as shaped to function as gridlines, busbars, pads or any type of conductive component of an electrical device. FIG. 6 shows substrate 605, back side 606 of substrate 605, heteroepitaxial layer 604, and patterned cap regions 602A following post-cap etch.

In some embodiments, ARC (703 in FIG. 7) may be applied over the heteroepitaxial layer 704. FIG. 7 shows substrate 705, back side 706 of substrate 705, heteroepitaxial layer 704, ARC 703, and patterned cap regions 702A following post-cap etch. Some embodiments may also employ the application of front side metal pads (801 in FIG. 8) and narrow metal gridlines (not shown). At the end of front side processing, a semiconductor wafer with an unmodified substrate layer (806) can be obtained, as shown in FIG. 8. FIG. 8 shows substrate 805, back side 806 of substrate 805, heteroepitaxial layer 804 overlying substrate 805, ARC 803, patterned cap regions 802A, and front side metal pad 801 electrically connected to patterned cap regions 802A.

In FIG. 9, the semiconductor wafer shown in FIG. 8 can be permanently bonded to a cover glass 908 with an optically clear adhesive 907. In some embodiments, the cover glass 908 may be space grade cover glass, which may be made of borosilicate glass. The back side of the substrate (806 in FIG. 8) can be thinned (909 in FIG. 9) by wet etching, back-grinding, or other methods. In some embodiments, the thinned substrate 905 can be between 20 μm and 200 μm thick post-thinning. Thinned devices are desirable in some applications, for example, space solar cells. FIG. 9 shows thinned substrate 905, back side 909 of thinned substrate 905, heteroepitaxial layer 904, ARC 903, patterned cap regions (post-cap etch) 902A, front side metal pad 901, optically clear adhesive 907, and cover glass 908.

In FIG. 10A, the back side 1009 of the substrate 1005 is patterned with a photosensitive polymer or any suitable type of suitable masking material in a desired TWV pattern (not shown), aligning TWV holes with front side metal pads 1001 and patterned cap regions 1002A that end up forming a perimeter around the ARC-adjacent region of the TWV holes 1010. Etching TWV holes 1010 starts from the back side 1009 of the substrate 1005 and, as shown in FIG. 10B, stops at the ARC layer 1003A. In some embodiments, the etchant mixture used can comprise a volumetric ratio of 10% to 50% hydrochloric acid with a volumetric ratio of 10% to 50% iodic acid in deionized water. The etchant mixture can have a temperature that ranges from 10° C. to 140° C. Etching stops at the ARC 1003 that serves as a selective dielectric etch stop layer 1011. Then, the patterned photosensitive polymer/masking material (not shown) and the ARC 1003 that is exposed in the TWV hole 1010 are removed. FIG. 10A also shows heteroepitaxial layer 1004, optically clear adhesive 1007, and cover glass 1008. FIG. 10B shows back side 1009 of substrate 1005, heteroepitaxial layer 1004, ARC layers 1003 and 1003A, patterned cap regions 1002A, front side metal pad 1001, optical adhesive 1007, and cover glass 1008. Through-wafer via 1010 is wet etched down to ARC layer 1003A and includes sidewalls 1010.

Suitable wet etchant mixtures comprising hydrochloric acid and iodic acid are disclosed, for example, in U.S. Application Publication No. 2013/0312817, which is incorporated by reference in its entirety. Smooth sidewalls etched with the etchant mixture can comprise traces of iodine. The heteroepitaxial sidewalls can be characterized by a macroscopically smooth surface without significant undercutting and that continuously widens from the substrate to the ARC. In some embodiments, the etchant mixture used can comprise a volumetric ratio of 30% to 35% hydrochloric acid with a volumetric ratio of 14% to 19% iodic acid in deionized water. The etchant mixture can have a temperature that ranges from 30° C. to 45° C.

U.S. Application Publication No. 2015/0349181 to Fidaner et al. discloses a method of etching mesa sidewalls in multijunction photovoltaic cells using a single-step wet etch process, where the etchant comprises a mixture of hydrochloric acid and iodic acid, which is incorporated by reference in its entirety. Fidaner demonstrates that the iodic etchant can be used to etch heteroepitaxial layers such as characteristic of multijunction photovoltaic cells having smooth sidewalls.

A wet etchant used to etch the TWVs can comprise iodic acid, hydrochloric acid, and water prepared in the molar ratios of 1:62:760, respectively. The molar ratios of iodic acid and hydrochloric acid can be within, for example, a variance of ±5%, such that the molar ratios in the mixture are within the ranges (0.95-1.05):(59-65):760, for iodic acid, hydrochloric acid, and water, respectively. The molar ratios of iodic acid and hydrochloric acid can be within, for example, a variance of ±10%, such that the molar ratios in the mixture are within the ranges (0.90-1.10):(56-68):760, for iodic acid, hydrochloric acid, and water, respectively. The molar ratios of iodic acid and hydrochloric acid can be within, for example, a variance of ±15%, such that the molar ratios in the mixture are within the ranges (0.85-1.15):(53-71):760, for iodic acid, hydrochloric acid, and water, respectively.

In terms of vol %, the iodic acid, hydrochloric acid and water can be combined in a 1:2:3 ratio by volume, wherein the aqueous solution of hydrochloric acid can be 38%±3% by weight and the aqueous solution of iodic acid can be 6.6%±1% by weight. The aqueous solution of hydrochloric acid can be 38%±6% by weight and the aqueous solution of iodic acid can be 6.6%±5% by weight. It is within the contemplation of the invention to use another solute or liquid mixtures besides water in the wet etch process, although water is the most readily available. Similarly, other acids of different molar concentration can be substituted for hydrochloric acid to yield the same result.

The wet etch results cross-sectional shape of the side wall profile characterized by a substantially macroscopically smooth curved profile, that is, having a substantially macroscopically smooth surface without significant undercutting of a junction region compared to other junction regions.

The wet etchant can comprise a volumetric ratio of hydrochloric acid from 10%-50% and the volumetric ratio of iodic acid in the mixture can be 10%-50%, where the aqueous solution of hydrochloric acid is 38%±3% by weight and the aqueous solution of iodic acid can be 6.6%±1.0% by weight, or 38%±5% by weight and the aqueous solution of iodic acid is 6.6%±5.0% by weight. It is to be understood the same molar ratios of the constituent chemicals can be provided using different volumetric ratios with different molarities in the aqueous solutions used. During processing, the temperature of the wet etchant can be maintained between 10° C. and 140° C., such as, for example, from 20° C. to 100° C., from 20° C. to 60° C., or from 30° C. to 50° C.

A wet etchant can comprise volumetric ratio of hydrochloric acid from 30% to 35% and a volumetric ratio of iodic acid from 14% to 19%, using the molarities in the aqueous solutions of the constituent chemicals, and the temperature of the mixture can be maintained between 30° C. and 45° C. A wet etchant can comprise volumetric ratio of hydrochloric acid from 27% to 38% and a volumetric ratio of iodic acid from 11% to 22%, using the molarities in the aqueous solutions of the constituent chemicals, and the temperature of the mixture can be maintained between 30° C. and 45° C.

Figure 4A:
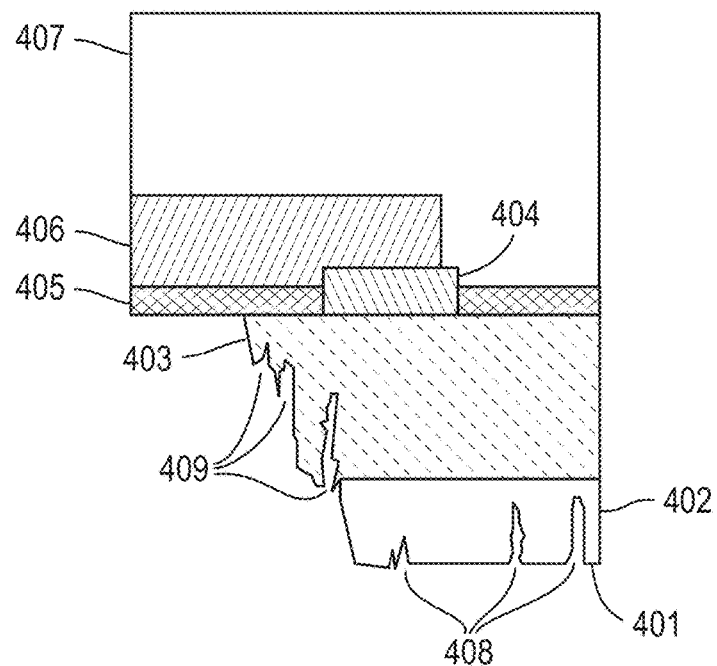
FIG. 4A is a schematic cross-section of a semiconductor wafer representative of a scanning electron microscopy image illustrating wafer damage caused by current methods.
Figure 4B:
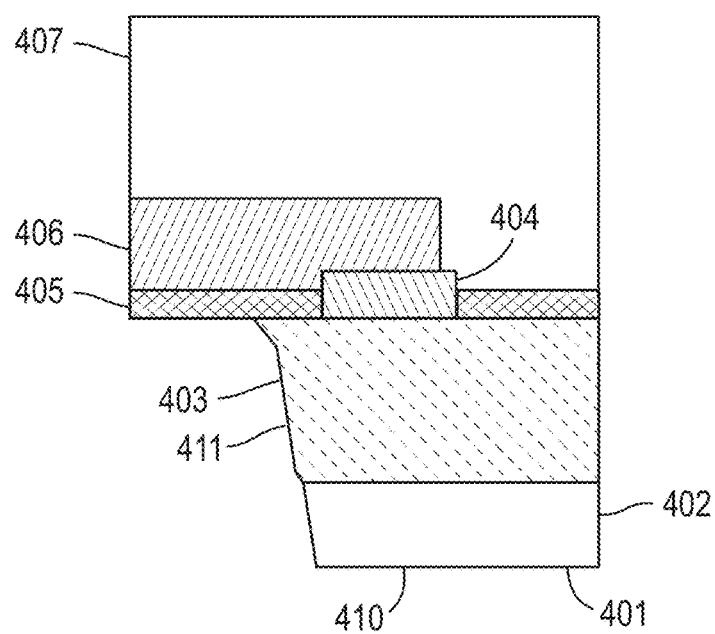
FIG. 4B is a schematic cross-section of a semiconductor wafer representative of a scanning electron microscopy image fabricated using methods provided by the present disclosure.

FIG. 11 shows the result of the steps described with reference to FIGS. 10A and 10B. Element 1112 is the exposed bottom of the front side metal pad 1101 after the ARC is removed from TWV hole 1110. The sidewalls 1010 of the TWV holes (1010 and 1110) are smooth, as shown in FIG. 4B; there is an absence of pitting (411) and rough sidewall surfaces that results using prior art methods (FIG. 4A). There is also an absence of pitting on the back side (410) of the wet etched back-thinned substrate (1009 and 1109) as shown in FIG. 4B—the semiconductor wafer is sufficiently protected by a photosensitive polymer/masking material (not shown) from etching that deviates from a desired etching pattern. The device shown in FIG. 4B includes cover glass 407, front side metal pad 406, patterned cap regions 404, ARC 405, heteroepitaxial layer 403, substrate 402, and back side surface 401 of substrate 402. The sidewalls 411 of heteroepitaxial layer 411 are smooth, without pitting and with reduced undercutting. Also, not pitting 410 is present on the back side surface 401 of substrate 402.

FIG. 11 shows front side metal pad 1101, patterned cap region (post-cap etch) 1102A, ARC (dielectric) 1103, heteroepitaxial layer 1104, substrate 105, optically clear adhesive 1007, cover glass 1108, backside of the wet etched back-thinned substrate 1109, TWV hole 1110, with sidewalls 1010, and exposed bottom of the front side metal pad 1112 after TWV etch stop removal.

The ARC 1103A at the top of the TWV 1010 serves as an etch stop for the wet etch. After the wet etch and via formation the ARC at the top of the TWV can subsequently be removed, for example by dry etching or by wet etching using, for example, hydrofluoric acid, to expose front side metal pad 1112 (FIG. 11). Residual ARC 1109 can remain between the patterned cap region 1102A and the TWV 1110. In certain embodiments, cap regions may not be present and the metal pad may overly only the ARC layer. After wet etch and TWV formation, a portion or the entire ARC layer previously underlying the metal pad may be removed to expose the lower surface of the metal pad. If a portion of the ARC layer is removed there will be an ARC layer between a portion of the metal pad and the heteroepitaxial layer.

The profiles shown FIG. 4A and FIG. 4B are for illustration purposes and other etch profiles may be characterized by other roughened and/or pitted surfaces. It is to be understood that the examples of semiconductor morphology illustrated in the present disclosure are not limited to the substrate, heteroepitaxial and processing layers. It is known to one skilled in the art that other embodiments may be present in semiconductor structures and devices.

As shown in FIG. 12, a passivation layer 1213 is applied over the back side 1209 of the wet etched back-thinned substrate according to a desired pattern to passivate the substrate 1205 from metal contact. The passivation layer 1213 also lines the walls of the TWV holes 1210. The passivation layer 1213 can be applied using standard deposition techniques, including for example, photosensitive polymer application, plasma-enhanced chemical vapor deposition, atomic layer deposition, and electrografting. In some embodiments, hard baking can be used in this step. The bottom 1212 of the front side metal pad 1201 remains exposed after TWV etch stop removal. FIG. 12 shows front side metal pad 1201, patterned cap regions (post-cap etch) 1202A, ARC 1203, heteroepitaxial layer 1204, substrate 1205, optically clear adhesive 1207, cover glass 1208, back side 1209 of the wet etched back-thinned substrate, TWV hole 1210, exposed bottom 1212 of the front side metal pad after TWV etch stop removal, and passivation layer 1213.

As shown in FIG. 13, substrate back side 1309 and TWV metal isolation resist pattern 1314 can be formed with a photosensitive polymer 1314) This patterning is carried out, for example, by photolithography techniques which may or may not require hard baking, depending on the specific embodiment. The bottom 1312 of the front side metal pad remains exposed 1312. FIG. 13 shows front side metal pad 1301, patterned cap regions (post-cap etch) 1302A, ARC 1303, heteroepitaxial layer 1304, substrate 1305, optically clear adhesive 1307, cover glass 1308, back side of the wet etched back-thinned substrate 11309, TWV hole 1310, exposed bottom 1312 of the front side metal pad after TWV retch stop removal, passivation layer 1313, and back side and TWV metal isolation resist pattern 1314.

In FIG. 14, TWV metal 1415 is applied such that the TWV metal 1415 lines the previously exposed bottom of the front side metal pad 1415 and lines the sidewalls 1416 of TWV holes 1410, forming an electrical connection to the TWV front side metal pad 1401. The TWV metal 1415 also lines a portion of the back side of the substrate (1417 and 1419), bounded by the resist 1414 from previous the step (FIG. 13). In some embodiments, these TWV and back side substrate metals (1415, 1416, 1417 and 1419) can be applied in a single deposition step. Sacrificial metal 1418 and metal isolation resist pattern 1414 are then lifted off to isolate positive and negative electrical contacts, leading to the product shown in FIG. 15.

FIG. 14 shows front side metal pad 1401, patterned cap regions (post-cap etch) 1402A, ARC 1403, heteroepitaxial layer 1404, thinned substrate 1405, optically clear adhesive 1407, and cover glass 1408, on the top side of the wet etched back-thinned substrate, TWV hole 1410, exposed bottom 1412 of the front side metal pad after TWV etch stop removal step, passivation layer 1413, back side 1414 and TWV metal isolation resist pattern, TWV metal 1415 deposited on the bottom of the TWV interconnecting directly to the top side metal pad, TWV metal 1416 deposited along the sidewalls of the TWV isolated from the heteroepitaxial stack and the substrate by the passivation layer, TWV metal 1417 deposited on the back side of the substrate, sacrificial metal 1418 on top of the isolation resist, and back side metal 1419.

The completed TWV structure shown in FIG. 15 includes front side metal pad 1501, patterned cap regions (post-cap etch) 1502A, ARC 1503, residual ARC 1520, heteroepitaxial layer 1504, substrate 1505, optically clear adhesive 1507, cover glass 1508, TWV hole 1510, ARC layer 1503, TWV metal 1515 deposited on the bottom of the TWV (electrically connects directly to the top side metal pad), TWV metal 1516 deposited along the sidewalls of the TWV isolated from the heteroepitaxial stack and the substrate by the passivation layer, TWV metal 1517 deposited on the back side of the substrate, and back side metal 1519.

A TWV can be, for example, from 20 μm to 50 μm deep, or from 10 μm to 200 μm deep. A TWV can have a width, for example, from about 10 μm to 500 μm, from 10 μm to 400 μm, from 100 μm to 400 μm, or from 100 μm to 250 μm. A TWV can be characterized, for example, by an aspect ratio from 0.5 to 1.5 from 0.8 to 1.2, or from 0.9 to 1.1.

Referring to FIG. 15, depending on the width of the top of the TWV structure, there can be a residual ARC layer 1503A or section between a portion of the front side metal 1501 and the heteroepitaxial layer 1504. The residual ARC layer 1503A can be between the patterned cap region 1502A and the passivation layer 1513 on the sidewalls of the TWV. If the width of the top of the TWV structure is large, then there may not be a residual ARC layer surrounding the top of the TWV within the patterned cap region. Passivation layer 1513 and ARC layer 1503 can comprise the same or can have similar compositions. Passivation layer 1513 and ARC layer 1503 can comprise different compositions. For example, passivation layer 1513 and ARC layer 1503 can comprise $SiO_2$, $TiO_2$, or a combination thereof. Passivation layer 1513 and ARC layer 1503 can comprise materials that minimize the mismatch in the coefficient of thermal expansion (CTE) between the passivation layer and ARC layer and the underlying and overlying layers. For example, the materials form the passivation layer and/or ARC layer can be selected to minimize the CTE mismatch between the passivation layer and/or ARC layer and GaAs.

Figure 16A:
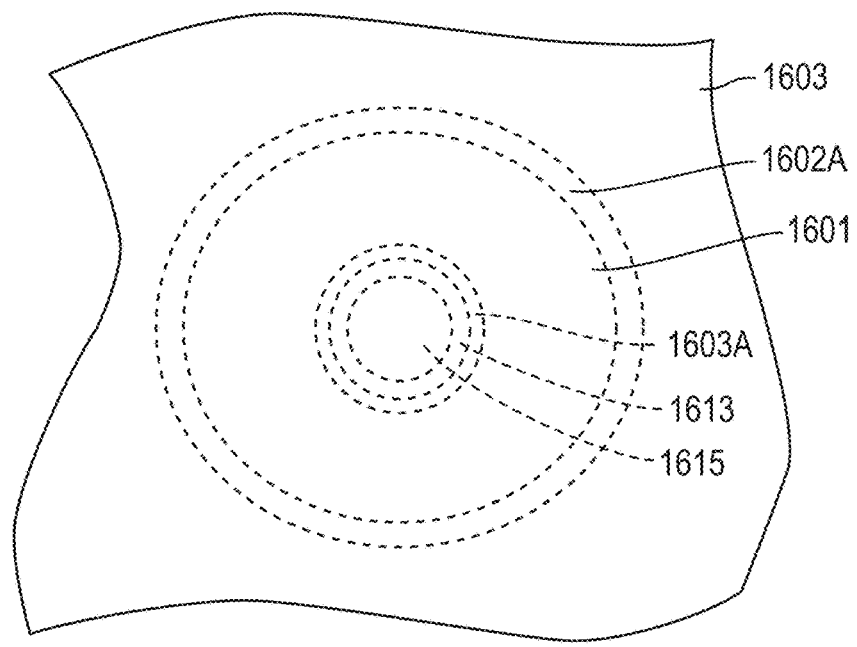
FIG. 16A is a top view of the multijunction solar cell shown in FIG. 15.
Figure 16B:
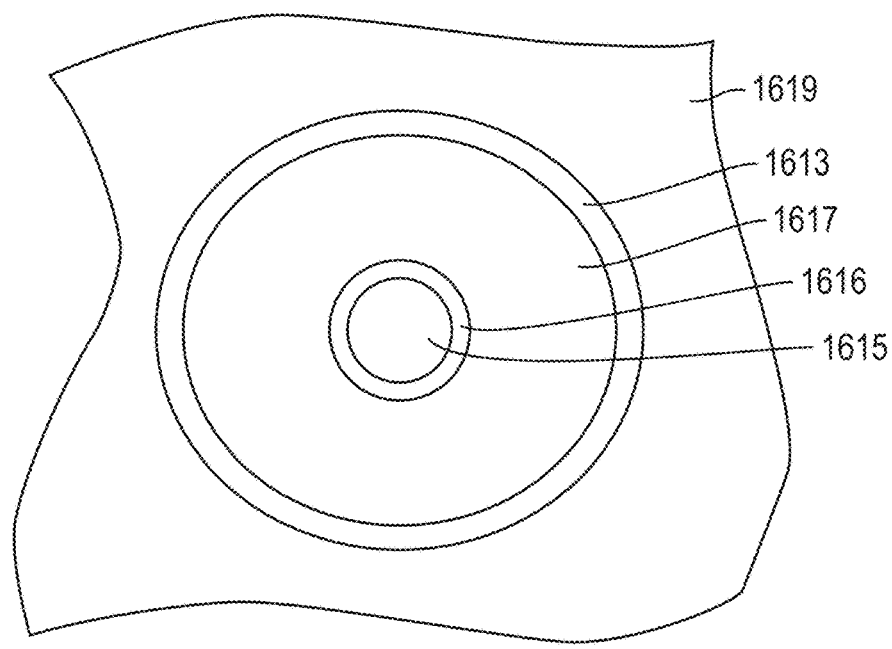
FIG. 16B is a bottom view of the multijunction solar cell shown in FIG. 16.

FIG. 16A and FIG. 16B each show a cross-section of a completed device viewed from the top of the semiconductor wafer and from the bottom of the semiconductor wafer, respectively. This device was manufactured by the processes shown in FIGS. 5-15. FIG. 16A and FIG. 16B represent an example of a particular embodiment and do not limit the present disclosure. Modifications in the processes and the resulting devices by one skilled in the art may result in final products with variations. Possible variations include device structure, shape, materials and dimensions. For example, although the patterned cap regions 1602A and front side metal pad 1601 are shown to be annular, they are not limited to this shape and represent only an embodiment of the present disclosure. Other shapes that may be used include, for example, squares and rectangles.

In the example of a device that is manufactured by the processes shown in FIGS. 5-15, a front side metal pad lies directly over the TWV hole. In another example, where the processes are as described in FIGS. 17-27, a metal plug can be present in a device that is manufactured by processes shown in FIGS. 5 and 17-27, while a front side metal pad is absent (not shown). The metal plug can be electrically conductive such as gold, silver, copper, or an alloy of any of the foregoing. Other electrically conductive metals can also be used. The plug can fill the TWV or can comprise one or more layers of electrically conductive metals. From the top side (FIG. 16A), the following components of the device are identified: front side metal pad 1601, patterned cap regions 1602, ARC 1603 outside of patterned cap regions 1602, ARC 1603A within patterned cap regions 1602, passivation layer 1613 and TWV metal 1615 that connects directly to the top side metal pad. From the bottom side (FIG. 16B), the following components of the device are identified: passivation layer 1613, TWV metal 1615 that connects directly to the top side metal pad, TWV metal 1616 along the sidewalls of the TWV isolated from the heteroepitaxial layer and the substrate by the passivation layer, TWV metal 1617 deposited on the back side of the substrate and back side metal 1619. These are examples of a particular embodiment and do not limit the scope of the disclosure. Modifications in the method and the device disclosed may result in final products with variations. The final product fabricated by methods in the disclosure will have smooth sidewalls 411 instead of lateral undercutting and pitting of the semiconductor wafer as shown, for example, in (FIGS. 4A and 4B). This is an advantageous improvement over prior art, resulting in improved fabrication reliability and yield of devices that comprise a heteroepitaxial layer.

Figure 17:
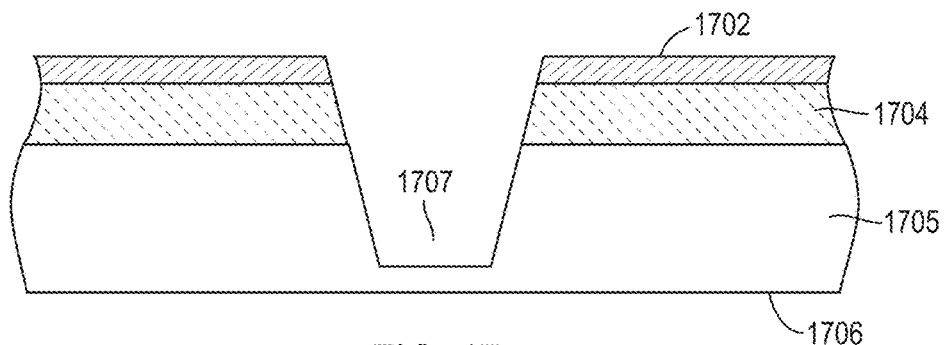
Figure 18:
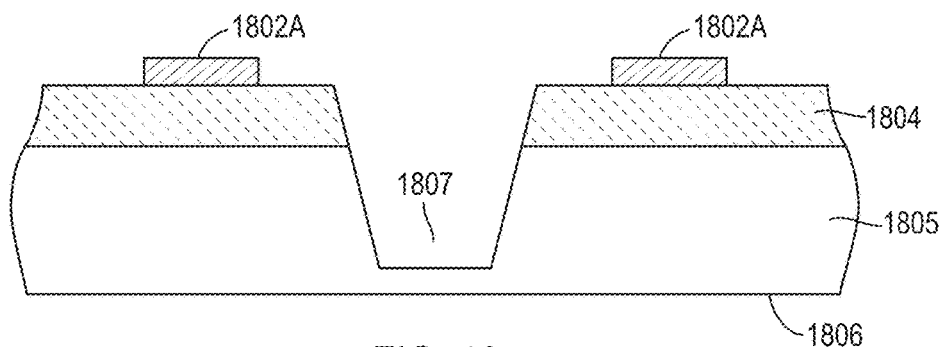
Figure 19:
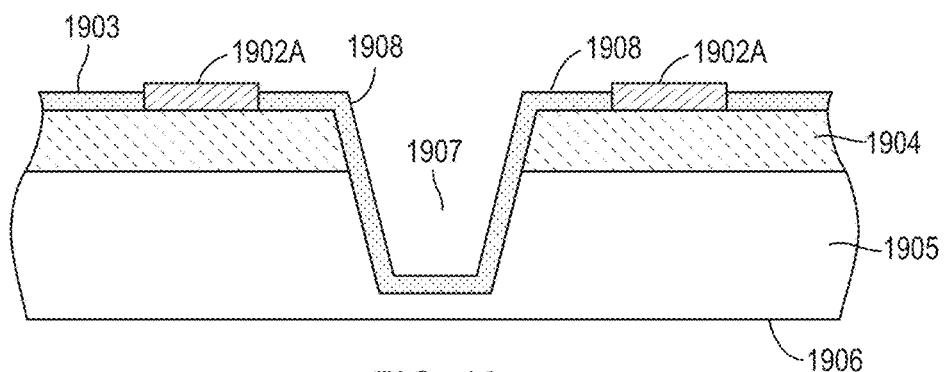
Figure 20:
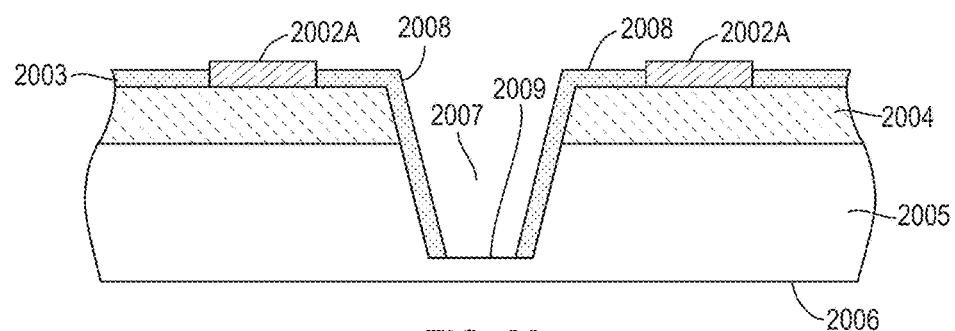
Figure 21:
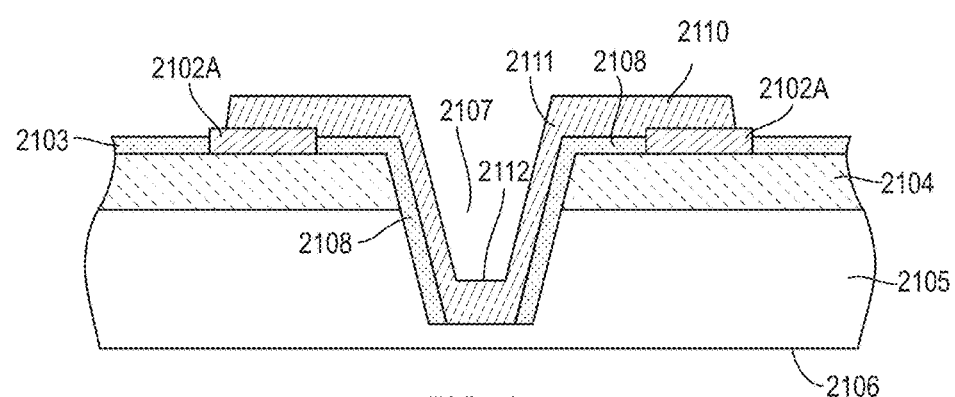
Figure 22:
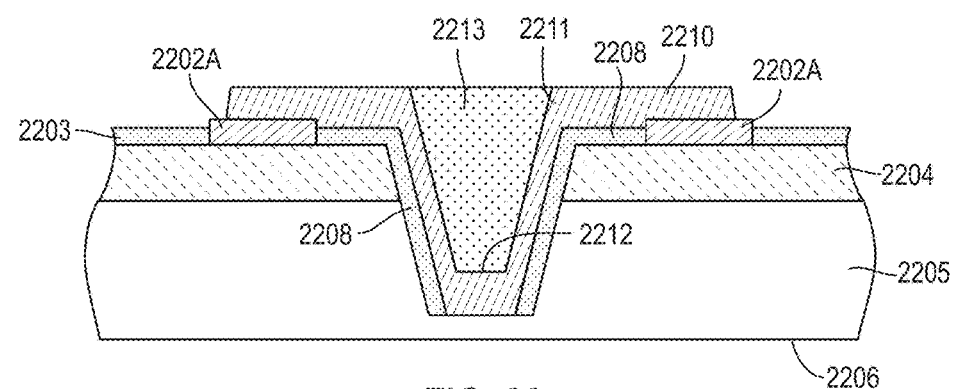
Figure 23:
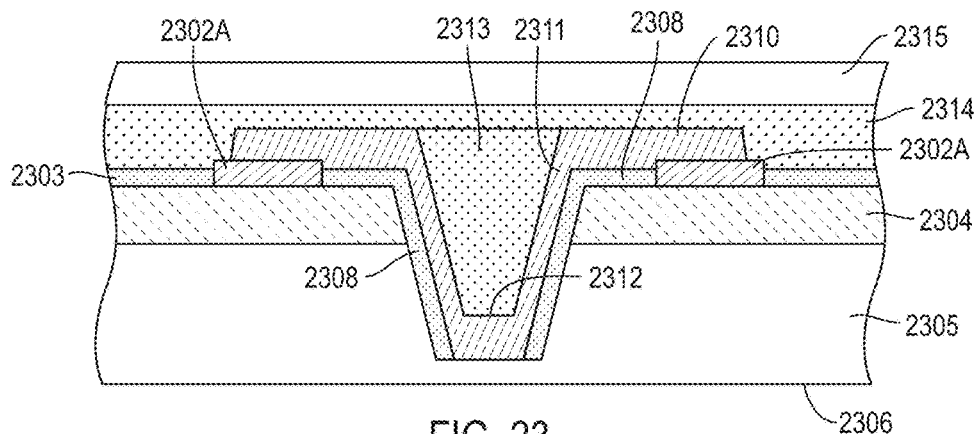
Figure 24:
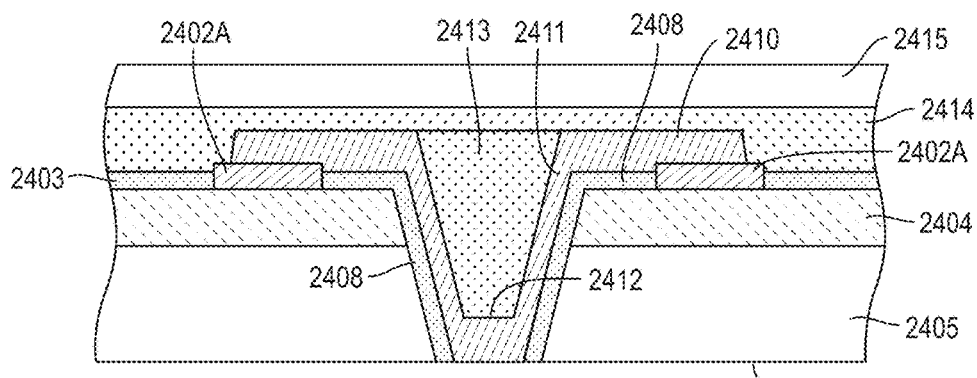
Figure 25:
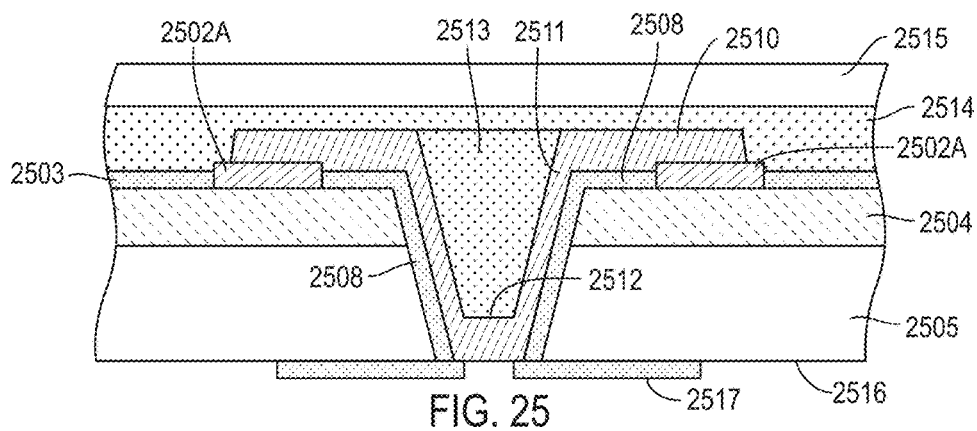
Figure 26:
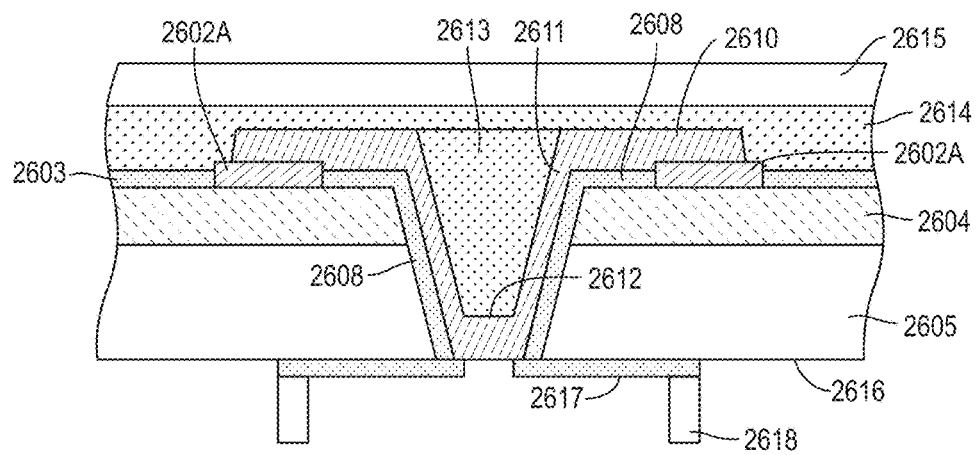
Figure 27:
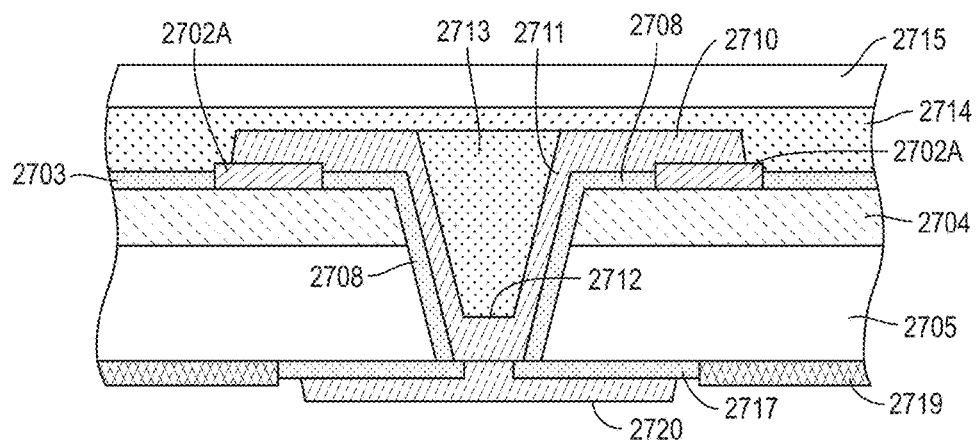
FIG. 27 is a cross-section of a multijunction solar cell with a TWV fabricated using the method illustrated in FIGS. 5 and 17-26.

FIGS. 5 and 17-27 show an aspect of the invention that comprises etching TWVs from the front side of a semiconductor wafer in the fabrication of a back-contact solar cell. FIGS. 5 and 17-23 show steps associated with front side processing, including the wet etch steps highlighted in the disclosure. FIGS. 24-27 show steps involved in back side processing. The process steps and final product described can be modified by one skilled in the art to accommodate a wide variety of semiconductor devices; the steps and final product are not limited to solar cells. The process steps illustrated in FIGS. 5 and 17-27 can be summarized as follows: FIG. 5 shows a heteroepitaxial layer on an unmodified substrate; FIG. 17 shows a wafer after via hole lithography and wet etch; FIG. 18 shows a wafer after contact cap layer patterning; FIG. 19 shows a wafer after ARC and passivation layer application, FIG. 20 shows a wafer after passivation layer removal from the bottom of TWV holes; FIG. 21 shows a wafer after front side metal seed layer lithography and evaporation; FIG. 22 shows a wafer after gold plug lithography and electroplating; FIG. 23 shows a wafer after mounting on glass; FIG. 24 shows a wafer after back-grinding and wet etch back-thinning; FIG. 25 shows a wafer after back side passivation layer patterning and hard bake; and FIG. 26 shows a wafer after back side and via-metal isolation lithography; and FIG. 27 shows a completed device after metal lift off (TWV metal and back side metal separation).

A semiconductor wafer (FIG. 5) can be provided comprising a heteroepitaxial layer 504 overlying the front side of the substrate 505, and a cap layer 502 overlying the front side of the heteroepitaxial layer 504. The substrate includes back side 506. Materials used to form the substrate include, for example, germanium, gallium arsenide, germanium alloys, and gallium arsenide alloys. Materials used to form the heteroepitaxial layer include, for example, alloys of one or more elements from group III and group V on the periodic table, such as indium gallium phosphide, indium phosphide, gallium arsenide, aluminum gallium arsenide, indium gallium arsenide, and dilute nitride compounds. The semiconductor wafer can undergo front side processing (FIGS. 5 and 17-22). TWV holes (1707 in FIG. 17) can be formed by wet etching as determined by a photosensitive polymer pattern or any type of suitable masking pattern (not shown). Etching of TWV holes 1707 starts from the front side of the cap layer 1702, extends through heteroepitaxial layer 1704, and stops at the substrate 1705 at any desired wafer depth before the wafer is etched completely through to the back side 1706. In some embodiments, the etchant mixture used is a volumetric ratio of 10% to 50% hydrochloric acid with a volumetric ratio of 10% to 50% iodic acid and deionized water. The mixture has a temperature that ranges from 10° C. to 140° C. The patterned photosensitive polymer/masking material (not shown) can be removed.

After wet etching TWV holes (1807 in FIG. 18), patterned cap regions 1802A are formed, guided by a photosensitive polymer pattern or any type of suitable masking pattern (not shown). The patterned cap regions 1802A may be patterned in a disk shape, but can also be patterned in a variety of geometric configurations, as well as shaped to function as gridlines, busbars, pads and any type of conductive component of an electrical device. FIG. 18 shows patterned cap regions (post-cap etch) 1802A, heteroepitaxial layer 1804, substrate 1805, back side 1806 of the substrate, and TWV hole 1807.

In FIG. 19, ARC (1903, 1908) functions as a passivation layer after it is applied over the heteroepitaxial layer 1904, surrounding patterned cap regions 1902A and the TWV sidewalls of TWV hole 1907. Photosensitive polymers can also be used as a passivation layer instead of an ARC. The passivation layer can be applied using standard deposition techniques, including for example, photosensitive polymer application, plasma-enhanced chemical vapor deposition, atomic layer deposition, and electrografting. In some embodiments, hard baking is required in this step. FIG. 19 also shows substrate 1905 and back side 1906 of substrate 1905.

In FIG. 20, the ARC or passivation layer is removed from the front side of the bottom of the TWV hole 2007 to expose the front side 2009 of the wafer substrate that lies at the bottom of the TWV hole 2007. FIG. 20 shows patterned cap regions (post-cap etch) 2002A, ARC 2003, heteroepitaxial layer 2004, substrate 2005, back side 2006 of the substrate, TWV hole 2007, ARC 2008, and exposed bottom 2009 of the via after removal of the passivation layer.

As shown in FIG. 21, metal is deposited from the front side of the semiconductor wafer, such that a metal seed layer 2111 lines the TWV holes 2107 by overlying the TWV sidewalls, the bottom of the TWV 2112 and the front side of the patterned cap regions 2102A and certain desired areas of the ARC 2103 within the patterned cap region. Metal deposition/metallization is guided by metal isolation resist pattern (not shown) that can be formed with a photosensitive polymer. This patterning can be carried out, for example, using standard photolithography techniques which may or may not require hard baking, depending on the specific embodiment. In some embodiments, this metallization step uses an evaporation method. The deposited metal seed layer can function as a front side metal pad as well as a conducting metal seed layer for electroplating the TWV sidewalls and the TWV bottom. Metal layer 2111 and 2112 represents a metal seed layer as well as a metal layer after depositing metal to a certain thickness. FIG. 21 shows patterned cap regions (post-cap etch) 2102A, ARC 2103, heteroepitaxial layer 2104, substrate 2105, back side 2106 of the substrate, TWV hole 2107, ARC 2108, front side metal 2110, metal seed layer 2111 deposited along the sidewalls of the TWV isolated from the heteroepitaxial stack and the substrate by the passivation layer (ARC 2108), and metal seed layer 2112 deposited on the bottom of the TWV 2107.

As shown in FIG. 22, gold can be applied by lithography and electroplating to form a gold plug 2213 in the TWVs, directly contacting the metal seed layer deposited on the TWV bottom and sidewalls (2211, 2212). The gold plug mechanically reinforces the TWV structure, allowing conduction of higher current density with low resistive losses. Other electrically conductive metals and alloys can be used to form plug 2213. FIG. 22 includes patterned cap regions (post-cap etch) 2202A, ARC 2203 along the sidewalls of the TWV and overlying the heteroepitaxial layer within patterned cap regions 2202A, heteroepitaxial layer 2204, substrate 2205, backside 2206 of the substrate, TWV hole 2207, ARC 2208, front side metal 2210, metal seed/deposited metal layer 2211 deposited along the sidewalls of the TWV isolated from the heteroepitaxial stack and the substrate by the passivation layer, metal seed layer/metal layer 2212 deposited on the bottom of the TWV, and electroplated gold plug 2213.

As shown in FIG. 23, the front side of the semiconductor wafer can be permanently bonded to cover glass 2315 with an optically clear adhesive 2314. In some embodiments, the cover glass may be space grade cover glass, which may be made of borosilicate glass. Now the semiconductor wafer is ready for further processing from the back side of the wafer. FIG. 23 includes patterned cap regions (post-cap etch) 2302A, ARC 2303, heteroepitaxial layer 2304, substrate 2305, back side 2306 of the substrate, TWV hole 2307, ARC 2308 overlying a portion of the heteroepitaxial layer within the patterned cap region, front side metal 2310, metal seed layer 2311 deposited along the sidewalls of the TWV isolated from the heteroepitaxial stack and the substrate by the passivation layer, metal seed layer 2312 deposited on the bottom of the TWV, electroplated gold plug 2313, optically clear adhesive 2314, and cover glass 2315.

As shown in FIG. 24, the back side of the substrate 2416 can be thinned by wet etching, back-grinding, or other methods. In some embodiments, the substrate can be between 20 and 200 μm thick post-thinning. Thinned devices are desirable in some applications, including, for example, space solar cells. The back side of the substrate can be thinned to expose the bottom portion of the metal 2412 within the TWV. FIG. 24 includes patterned cap regions (post-cap etch) 2402A, ARC 2403, heteroepitaxial layer 2404, substrate 2405, TWV hole 2407, ARC 2408, front side metal 2410, metal seed layer 2411 deposited along the sidewalls of the TWV isolated from the heteroepitaxial stack and the substrate by the passivation layer (ARC 2408), metal seed layer 2412 deposited on the bottom of the TWV, electroplated gold plug 2413, optically clear adhesive 2414, cover glass 2415, and back side of the wet etched back-thinned substrate 2416.

As shown in FIG. 25, a passivation layer 2517 can be applied on the back side 2516 of the substrate 2505 according to a desired pattern to passivate the substrate from metal contact. The passivation layer 2508 also lines the walls of the TWV holes. The passivation layer 2517 can be applied using standard deposition techniques, including, for example, photosensitive polymer application, plasma-enhanced chemical vapor deposition, atomic layer deposition, and electrografting. In some embodiments, hard baking is required in this step. The bottom of the front side metal pad 2512 remains exposed. FIG. 25 includes patterned cap regions (post-cap etch) 2502A, ARC 2503, heteroepitaxial layer 2504, substrate 2505, ARC 2508 along the sidewalls of the TWV and overlying a portion of the heteroepitaxial layer within the patterned cap regions, front side metal 2510, metal seed layer 2511 deposited along the sidewalls of the TWV isolated from the heteroepitaxial stack and the substrate by the passivation layer, metal seed layer 2512 deposited on the bottom of the TWV, electroplated gold plug 2513, optically clear adhesive 2514, cover glass 2515, back side of the wet etched back-thinned substrate 2516, and back side passivation layer 2517.

As shown in FIG. 26, back side and TWV metal isolation resist pattern 2618 can be applied to determine the subsequent deposition of back side metal (2719 in FIG. 27) and TWV metal (2720 in FIG. 27). In some embodiments, these back side and TWV metals can be applied in a single deposition step. FIG. 26 includes patterned cap regions (post-cap etch) 2602A, ARC 2603, heteroepitaxial layer 2604, substrate 2605, TWV hole 2607, ARC 2608, front side metal 2610, metal seed layer 2611 deposited along the sidewalls of the TWV isolated from the heteroepitaxial stack and the substrate by the passivation layer, metal seed layer 2612 deposited on the bottom of the TWV, electroplated gold plug 2613, optically clear adhesive 2614, cover glass 2615, back side of the wet etched back-thinned substrate 2616, passivation layer 2617, and back side and TWV metal isolation resist pattern 2618.

FIG. 27 shows a completed device after the back side sacrificial metal and the metal isolation resist pattern are lifted off to isolate positive and negative electrical contacts. FIG. 27 shows patterned cap regions (post-cap etch) 2702A, ARC 2703, heteroepitaxial layer 2704, substrate 2705, TWV hole 2707, ARC 2708, front side metal 2710, metal seed layer 2711 deposited along the sidewalls of the TWV isolated from the heteroepitaxial stack and the substrate by the passivation layer, metal seed layer 2712 deposited on the bottom of the TWV, electroplated gold plug 2713, optically clear adhesive 2714, cover glass 2715, passivation layer 2717, back side metal 2719, and TWV metal 2720 deposited on the back side of the semiconductor wafer.

In an aspect of the invention, a method of forming a semiconductor device comprises the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and at least one additional subcell overlying the first subcell; and at least one of the first subcell or the at least one additional subcell comprises an alloy comprising one or more elements from group III of the periodic table, N, As, and an element selected from Sb, Bi and a combination thereof; a plurality of patterned cap regions overlying the heteroepitaxial layer; an anti-reflective coating overlying the heteroepitaxial layer; and; a corresponding metal region overlying each of the plurality of patterned cap regions; bonding a cover glass to the front side of the semiconductor wafer with an optically clear adhesive; removing a desired amount from the semiconductor wafer by a thinning of the substrate region from the back side of the semiconductor wafer; patterning the back side of the semiconductor wafer with a back etch through-wafer via pattern; etching from the back side of the semiconductor wafer a plurality of through-wafer vias using a single wet etchant mixture, wherein each of the plurality of through-wafer vias extends from the back side of the semiconductor wafer to the anti-reflective coating overlying the heteroepitaxial layer; removing the anti-reflective coating to expose a bottom side of the corresponding metal region with a subsequent wet etching method, wherein the subsequent wet etching method is specific for the removal of the anti-reflective coating; depositing a passivation layer on the through-wafer via walls with standard deposition techniques; depositing a resist pattern on the back side of the semiconductor wafer for back side metal isolation, wherein the resist pattern underlies the passivation layer; depositing a metal on the back side of the semiconductor wafer and on the through-wafer via; and removing the resist pattern and a sacrificial metal.

In an aspect of the invention, a method of forming a semiconductor device comprises the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and an at least one additional subcell overlying the first subcell; at least one subcell comprises an alloy comprising one or more elements from group III of the periodic table, N, As, and an element selected from Sb, Bi and a combination thereof; and a cap layer overlying the heteroepitaxial layer; patterning the front side of the semiconductor wafer with a front etch through-wafer via pattern; etching from the front side of the semiconductor wafer a plurality of through-wafer vias using a single wet etchant mixture, wherein, each of the plurality of through-wafer vias extends from the front side surface of the semiconductor wafer into the substrate; patterning the plurality of patterned cap regions on the heteroepitaxial layer on the front side of the semiconductor wafer; depositing an anti-reflective coating overlying the heteroepitaxial layer and the through-wafer via sidewalls; removing, from the front side, the anti-reflective coating from the bottom of the through-wafer via holes; depositing a front side resist pattern from the front side of the semiconductor wafer, wherein the front side resist pattern guides metal layer lithography; and depositing a metal on the front side of the semiconductor wafer, on the through-wafer via sidewalls and on the through-wafer via bottom.

In any of the preceding aspects, the anti-reflective coating is a passivation layer.

In any of the preceding aspects, the passivation layer comprises photosensitive polymers.

In any of the preceding aspects, the wet etchant mixture comprises: a volumetric ratio of hydrochloric acid of 10% to 50%; volumetric ratio of iodic acid of 10% to 50%; and deionized water, wherein the single wet etchant mixture has a temperature of 10° C. to 140° C.

In any of the preceding aspects, the back etch through-wafer via pattern and the front etch through-wafer via pattern is formed using a photoresist, using a hard mask, or using both a photoresist and a hard mask.

In any of the preceding aspects, wherein the semiconductor device comprises a solar cell.

In any of the preceding aspects, the semiconductor device comprises a solar cell or a back-contact solar cell.

In any of the preceding aspects, the method further comprises filling each of the plurality of through-wafer vias with gold.

In any of the preceding aspects, the method further comprises: bonding a cover glass to the front side surface of the semiconductor wafer with an optically clear adhesive; removing a desired amount of the semiconductor wafer by a thinning of the substrate region from the back side of the semiconductor wafer; depositing a passivation layer with standard deposition techniques or lithography on the back side of the semiconductor wafer, wherein the passivation layer is guided by a passivation layer pattern; depositing a back side metal isolation resist pattern on the back side of the semiconductor, wherein the back side metal isolation resist pattern underlies the passivation layer depositing a metal on the back side of the semiconductor wafer; and removing the back side metal isolation resist pattern and a sacrificial metal.

In any of the preceding aspects, the thinning of the substrate region from the back side of the semiconductor wafer is achieved by wet etching, back-grinding or substrate lift-off, or any combination of these methods.

In an aspect of the invention, a semiconductor device comprises: a heteroepitaxial layer, further comprising an alloy comprising one or more elements from group III of the periodic table, N, As, and an element selected from Sb, Bi and a combination thereof; and a plurality of through-wafer vias characterized by the absence of pitting on smooth sidewall surfaces formed by the method of any of the preceding aspects of the invention.

In any of the preceding aspects, the heteroepitaxial layer comprises $Ga_{1-x}In_xN_yAs_{1-y-z}Sb_z$; and the content values for x, y, and z are within composition ranges as follows: $0.03 \leq x \leq 0.22$, $0.007 \leq y \leq 0.055$ and $0.001 \leq z \leq 0.05$.

In any of the preceding aspects, the semiconductor device is a back-contact multijunction photovoltaic cell.

In an aspect of the invention, a through-wafer via structure comprises: a substrate comprising a back side and a front side; a heteroepitaxial layer overlying the front side of the substrate; an antireflection coating overlying a first portion of the heteroepitaxial layer; a patterned cap region overlying a second portion of the heteroepitaxial layer; a front side metal pad overlying and electrically connected to the patterned cap region, wherein the front side metal pad comprises a bottom surface; and a through-wafer via extending from the back side of the substrate to the front side metal pad, wherein the through-wafer via comprises sidewalls; a passivation layer overlying a portion of the back side of the substrate and the sidewalls of the through-wafer via; and a metal layer overlying the passivation layer and the bottom surface of the front side metal pad within the through-wafer via.

In any of the preceding aspects, the heteroepitaxial layer comprises one or more elements from group III of the periodic table, N, As, and an element selected from Sb, Bi and a combination thereof.

In any of the preceding aspects, the heteroepitaxial layer comprises one or more subcells of a multijunction solar cell, wherein at least one of the subcells comprises one or more elements from group III of the periodic table, N, As, and an element selected from Sb, Bi and a combination thereof.

In any of the preceding aspects, the through-wafer via is characterized by smooth sidewall surfaces and the back side of the substrate is free of pitting.

In an aspect of the invention, a semiconductor device comprises the through-wafer via structure according to any of the preceding aspects of the invention.

In an aspect of the invention, a through-wafer via structure comprises: a substrate comprising a back side and a front side; a heteroepitaxial layer overlying the front side of the substrate; an anti-reflection coating overlying a first portion of the heteroepitaxial layer; a patterned cap region overlying a second portion of the heteroepitaxial layer; a front side metal overlying a portion of the anti-reflection coating and the patterned cap region; a through-wafer via extending from the back side of the substrate through a portion of the anti-reflection coating; a passivation layer overlying side walls of the through-wafer via; a metal seed layer overlying the passivation layer and plugging the bottom of the through-wafer via; and a metal overlying the metal seed layer and filling the through-wafer via.

In any of the preceding aspects, the heteroepitaxial layer comprises one or more elements from group III of the periodic table, N, As, and an element selected from Sb, Bi and a combination thereof.

In any of the preceding aspects, the heteroepitaxial layer comprises one or more subcells of a multijunction solar cell, wherein at least one of the subcells comprises one or more elements from group III of the periodic table, N, As, and an element selected from Sb, Bi and a combination thereof.

In any of the preceding aspects, the through-wafer via is characterized by smooth sidewall surfaces and the back side of the substrate is free of pitting.

In an aspect of the invention, a semiconductor device comprising the through-wafer via structure according to any of the preceding aspects.

According to an aspect of the invention, a through-wafer via structure comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a back surface solder pad underlying a portion of and electrically connected to the back substrate surface; a front surface solder pad underlying and insulated from the back substrate surface; and a through-wafer-via interconnecting the front surface solder pad and the front surface contact.

According to any of the preceding aspects, the substrate is less than 150 μm thick.

According to any of the preceding aspects, the heteroepitaxial layer comprises at least two junctions of a multijunction solar cell.

According to any of the preceding aspects, the method further comprises: an antireflection coating overlying a first portion of the heteroepitaxial layer; a patterned cap region overlying a second portion of the heteroepitaxial layer; a front side metal pad overlying and electrically connected to the patterned cap region, wherein the front side metal pad comprises a bottom surface; and a through-wafer-via extending from the back substrate surface to the front side metal pad, wherein the through-wafer-via comprises sidewalls; a passivation layer overlying a portion of the back substrate surface and the sidewalls of the through-wafer-via; and a metal layer underlying the passivation layer and the bottom surface of the front side metal pad within the through-wafer-via.

According to any of the preceding aspects, the through-wafer-via is characterized by smooth sidewall surfaces and the back substrate surface is free of pitting.

According to any of the preceding aspects, the method further comprises: an anti-reflection coating underlying a first portion of the heteroepitaxial layer; a patterned cap region overlying a second portion of the heteroepitaxial layer; a front side metal overlying a portion of the anti-reflection coating and the patterned cap region; a through-wafer via extending from the back substrate surface through a portion of the anti-reflection coating; a passivation layer overlying side walls of the through-wafer-via; a metal layer overlying the passivation layer and plugging the bottom of the through-wafer via; and a metal overlying the metal layer and filling the through-wafer-via.

According to any of the preceding aspects, the method further comprises an anti-reflection coating layer between a portion of the front side metal and the heteroepitaxial layer.

According to any of the preceding aspects, the method further comprises an anti-reflection coating layer between a portion of the through wafer via sidewall and the patterned cap region.

According to an aspect of the invention, a semiconductor device comprises a plurality of the through wafer via structures according to the invention.

According to any of the preceding aspects, the semiconductor device is characterized by a unit mass per area of less than 0.09 g/cm$^2$.

According to an aspect of the invention, a method of fabricating a through wafer via structure, comprises: providing a semiconductor wafer, wherein the semiconductor wafer comprises: a substrate comprising a front substrate surface and a back substrate surface; a heteroepitaxial layer overlying the front substrate surface; a front surface contact overlying and electrically connected to a portion of the heteroepitaxial layer; an optical adhesive overlying the front surface contact and the heteroepitaxial layer; and a coverglass overlying the optical adhesive layer; and thinning the substrate.

According to any of the preceding aspects, the method further comprises, forming a through-wafer-via interconnecting the front surface contact to a front contact pad underlying the back substrate surface.

According to any of the preceding aspects, forming a through-wafer-via comprises wet etching using an etchant mixture comprising iodic acid, hydrofluoric acid, and water.

According to any of the preceding aspects, the method further comprises forming a back surface contact interconnected to the back substrate surface.

According to any of the preceding aspects, thinning the substrate comprises wet etching, back-grinding, lift-off, or any combination of any of the foregoing.

According to any of the preceding aspects, the heteroepitaxial layer comprises at least two junctions of a multijunction solar cell.

According to an aspect of the invention, a through wafer via structure comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a passivation layer underlying a portion of the back substrate surface; a back metal pad underlying a portion of the passivation layer; a through-wafer-via electrically interconnecting the front metal contact and the back metal pad; and a backside metal electrically connected to the back substrate surface.

According to any of the preceding aspects, a through-wafer via structure further comprises a patterned cap region overlying a portion of the heteroepitaxial layer; and an antireflection coating overlying a portion of the heteroepitaxial layer; wherein the front surface contact overlies the patterned cap region and is electrically connected to the patterned cap region.

According to any of the preceding aspects, the antireflection coating overlies the heteroepitaxial within the patterned cap region; and the antireflection coating overlies the sidewalls of the through-wafer-via.

According to any of the preceding aspects, the substrate is less than 150 μm thick.

According to any of the preceding aspects, the heteroepitaxial layer comprises at least two junctions of a multijunction solar cell.

According to any of the preceding aspects, the through-wafer via structure comprises a gold plug filling the through-wafer via.

According to an aspect of the invention, a semiconductor device comprises a plurality of the through wafer via structures according to the invention.

According to any of the preceding aspects, the semiconductor device is characterized by a unit mass per area of less than 0.09 g/cm$^2$.

According to an aspect of the invention, a method of fabricating a through wafer via structure comprises: providing a semiconductor wafer, wherein the semiconductor wafer comprises: a substrate having a front substrate surface and a back substrate surface; a heteroepitaxial layer overlying the front substrate surface; and a patterned cap region overlying a first portion of the heteroepitaxial layer; etching a through-wafer-via extending from the heteroepitaxial layer to within the substrate; depositing an antireflection coating on a second portion of the heteroepitaxial layer and on a sidewall and a bottom of the through-wafer-via; etching the antireflection coating on the bottom of the through-wafer-via to expose the substrate; depositing a front surface contact overlying at least a portion of the patterned cap region, the antireflection coating within the patterned cap region, the sidewalls of the through-wafer-via, and the bottom of the through-wafer-via; applying an optical adhesive overlying the front surface contact, the patterned cap region, and the antireflection coating; applying a coverglass overlying the optical adhesive; and thinning the substrate.

According to any of the preceding aspects, the heteroepitaxial layer comprises at least two junctions of a multijunction solar cell.

According to any of the preceding aspects, etching a through-wafer-via comprises wet etching using an etchant mixture comprising iodic acid, hydrofluoric acid, and water.

According to any of the preceding aspects, thinning the substrate comprises exposing the front surface contact at the bottom of the through-wafer-via.

According to any of the preceding aspects, thinning the substrate comprises wet etching, back-grinding, lift-off, or any combination of any of the foregoing.

There are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:
1. A through-wafer via structure, comprising:
a substrate having a front substrate surface and a back substrate surface;
a plurality of heteroepitaxial layers overlying the front substrate surface, wherein the plurality of heteroepitaxial layers has a top surface;
an anti-reflection coating overlying a first portion of the plurality of heteroepitaxial layers;

a patterned cap region overlying and electrically connected to a second portion of the plurality of heteroepitaxial layers, wherein the patterned cap region has a top surface;

a front surface contact overlying and electrically connected to the patterned cap region, wherein
the front surface contact has a bottom surface; and
the bottom surface of the front surface contact lies between the top surface of the patterned cap region and the top surface of the plurality of heteroepitaxial layers; and a through-wafer via interconnecting a front surface solder pad and the front surface contact, wherein, the through-wafer via comprises:
a side wall;
a passivation layer lining the sidewall and contacting the front surface contact; and
a metal layer underlying the passivation layer and directly contacting the bottom surface of the front surface contact within the through-wafer via.

2. The through-wafer via structure of claim 1, wherein the plurality of heteroepitaxial layers comprises at least two junctions of a multijunction solar cell.

3. The through-wafer via structure of claim 1, wherein:
a first portion of the anti-reflection coating overlies the first portion of the plurality of heteroepitaxial layers;
the patterned cap region overlies the second portion of the plurality of heteroepitaxial layers;
a second portion of the anti-reflection coating overlies a third portion of the plurality of heteroepitaxial layers, wherein the third portion of the plurality of heteroepitaxial layers is within the patterned cap region; and
the metal layer plugs the bottom of the through-wafer via;
and further comprising:
a metal overlying the metal layer and filling the through-wafer via; wherein the front surface contact overlies the second portion of the anti-reflection coating and the patterned cap region and the through-wafer via extends from the back substrate surface through the second portion of the anti-reflection coating.

4. The through-wafer via structure of claim 1, wherein the second portion of the anti-reflection coating is located between a portion of the front surface contact and the plurality of heteroepitaxial layers.

5. The through-wafer via structure of claim 1, wherein the second portion of the anti-reflection coating is located between the through-wafer via and the patterned cap region.

6. A semiconductor device comprising a plurality of the through-wafer via structures of claim 1.

7. The semiconductor device of claim 6, wherein the semiconductor device is characterized by a unit mass per area of less than 0.09 g/cm$^2$.

8. A method of fabricating a through-wafer via structure, comprising:
providing a semiconductor wafer, wherein the semiconductor wafer comprises:
a substrate comprising a front substrate surface and a back substrate surface;

a plurality of heteroepitaxial layers overlying the front substrate surface, wherein the plurality of heteroepitaxial layers has a top surface;
an anti-reflection coating overlying a first portion of the plurality of heteroepitaxial layers;
a patterned cap region overlying and electrically connected to a second portion of the plurality of heteroepitaxial layers, wherein the patterned cap region has a top surface;
a front surface contact overlying and electrically connected to the patterned cap region and having a bottom surface;
wherein the bottom surface of the front surface contact lies between the top surface of the patterned cap region and the top surface of the plurality heteroepitaxial layers;
an optical adhesive overlying the front surface contact and the plurality of heteroepitaxial layers; and
a coverglass overlying the optical adhesive layer;
forming a through-wafer via interconnecting the front surface contact to a front contact pad underlying the back substrate surface wherein forming the through-wafer via includes etching the back surface of the substrate to expose the bottom surface of the front surface contact; and
depositing a passivation layer on sidewalls of the through-wafer via; and depositing a metal layer within the through-wafer via underlying the passivation layer which directly contacts the bottom surface of the front surface contact.

9. The method of claim 8, wherein forming a through-wafer via comprises wet etching the substrate and the plurality of heteroepitaxial layers using an etchant mixture comprising iodic acid, hydrofluoric acid, and water.

10. The method of claim 8, further comprising forming a back surface contact interconnected to the back substrate surface.

11. The method of claim 8, further comprising thinning the substrate to a thickness less than 150 µm, wherein thinning the substrate comprises wet etching, back-grinding, lift-off, or any combination of any of the foregoing.

12. The method of claim 8, wherein the plurality of heteroepitaxial layers comprises at least two junctions of a multijunction solar cell.

13. The through-wafer via structure of claim 1, wherein the anti-reflection coating does not overly the front surface contact.

14. The through-wafer via structure of claim 1, wherein the sidewall comprises trace iodine.

15. The through-wafer via structure of claim 1, wherein the sidewall is without pitting and undercutting.

16. The through-wafer via structure of claim 1, wherein the sidewall is characterized by a smooth curved profile, having a smooth surface without undercutting of a junction region compared to other junction regions.

17. The through-wafer via structure of claim 1, wherein the substrate has a thickness less than 150 µm.

* * * * *